US012787674B2

(12) United States Patent
Tirukkonda et al.

(10) Patent No.: US 12,787,674 B2
(45) Date of Patent: Nov. 3, 2026

(54) METHOD OF MAKING HIGH ASPECT RATIO OPENINGS USING MULTIPLE CLADDING MASKS AND APPARATUS FOR IMPLEMENTING THE SAME

(71) Applicant: SANDISK TECHNOLOGIES LLC, Addison, TX (US)

(72) Inventors: Roshan Jayakhar Tirukkonda, Milpitas, CA (US); Rahul Sharangpani, Fremont, CA (US); Senaka Kanakamedala, San Jose, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 470 days.

(21) Appl. No.: 18/359,664

(22) Filed: Jul. 26, 2023

(65) Prior Publication Data

US 2024/0290622 A1 Aug. 29, 2024

Related U.S. Application Data

(60) Provisional application No. 63/486,511, filed on Feb. 23, 2023.

(51) Int. Cl.
*H10P 50/64* (2026.01)
*H10B 43/10* (2023.01)
(Continued)

(52) U.S. Cl.
CPC ........... *H10P 50/644* (2026.01); *H10B 43/10* (2023.02); *H10B 43/27* (2023.02); *H10B 43/35* (2023.02);
(Continued)

(58) Field of Classification Search
CPC .......................... H10P 50/73; H10B 43/00-50
See application file for complete search history.

(56) References Cited

U.S. PATENT DOCUMENTS 8,614,126 B1 12/2013 Lee et al.
9,093,480 B2 7/2015 Makala et al.
(Continued)

OTHER PUBLICATIONS

Chou, C.H. et al., "Platinum metal etching in a microwave oxygen plasma," Journal of Applied Physics, vol. 68, 2415 (1990); https://doi.org/10.1063/1.346501.
(Continued)

*Primary Examiner* — William B Partridge
*Assistant Examiner* — Alexandre X Ramirez
(74) *Attorney, Agent, or Firm* — THE MARBURY LAW GROUP PLLC

(57) ABSTRACT

A method includes forming an alternating stack of first material layers and second material layers over a substrate, forming an etch mask material layer over the alternating stack, loading the etch mask material layer, the alternating stack, and the substrate into an integrated processing apparatus including a plurality of etch chambers and at least one cladding liner deposition chamber; and iteratively performing multiple instances of a unit processing sequence without breaking vacuum. The unit processing sequence includes a respective cladding liner deposition process in which a respective cladding material is anisotropically deposited over the etch mask material layer in a respective one of the at least one cladding liner deposition chamber, and a respective anisotropic etch process in which respective portions of the alternating stack that are not masked by the etch mask material layer are anisotropically etched in a respective etch chamber selected from the plurality of etch chambers.

14 Claims, 27 Drawing Sheets

(51) Int. Cl.

| | |
|---|---|
| ***H10B 43/27*** | (2023.01) |
| ***H10B 43/35*** | (2023.01) |
| ***H10P 30/00*** | (2026.01) |
| ***H10P 72/30*** | (2026.01) |
| ***H10W 20/00*** | (2026.01) |
| ***H10W 20/41*** | (2026.01) |
| ***H10W 20/42*** | (2026.01) |

(52) U.S. Cl.

CPC .......... *H10P 30/00* (2026.01); *H10P 72/3304* (2026.01); *H10W 20/045* (2026.01); *H10W 20/42* (2026.01); *H10W 20/435* (2026.01)

(56) References Cited

U.S. PATENT DOCUMENTS

| | | | | |
|---|---|---|---|---|
| 9,099,496 | B2 | 8/2015 | Tian et al. | |
| 9,331,094 | B2 | 5/2016 | Hada | |
| 9,379,124 | B2 | 6/2016 | Sharangpani et al. | |
| 9,496,419 | B2 | 11/2016 | Sharangpani et al. | |
| 9,524,976 | B2 | 12/2016 | Pachamuthu et al. | |
| 9,530,788 | B2 | 12/2016 | Oginoe et al. | |
| 9,548,313 | B2 | 1/2017 | Yada et al. | |
| 9,570,460 | B2 | 2/2017 | Kanakamedala et al. | |
| 9,666,590 | B2 | 5/2017 | Chien et al. | |
| 9,768,270 | B2 | 9/2017 | Gunji-Yoneoka et al. | |
| 9,806,090 | B2 | 10/2017 | Sharangpani et al. | |
| 9,985,098 | B2 | 5/2018 | Matsumoto et al. | |
| 9,991,280 | B2 | 6/2018 | Nakamura et al. | |
| 10,008,570 | B2 | 6/2018 | Yu et al. | |
| 10,020,363 | B2 | 7/2018 | Ogawa et al. | |
| 10,056,399 | B2 | 8/2018 | Costa et al. | |
| 10,199,359 | B1 | 2/2019 | Sakakibara et al. | |
| 10,224,340 | B2 | 3/2019 | Hada et al. | |
| 10,381,443 | B2 | 8/2019 | Matsumoto et al. | |
| 10,438,964 | B2 | 10/2019 | Makala et al. | |
| 11,018,152 | B2 | 5/2021 | Hinoue et al. | |
| 11,101,284 | B2 | 8/2021 | Pachamuthu et al. | |
| 2015/0076580 | A1 | 3/2015 | Pachamuthu et al. | |
| 2015/0318297 | A1 | 11/2015 | Hada | |
| 2015/0348984 | A1 | 12/2015 | Yada et al. | |
| 2015/0380419 | A1 | 12/2015 | Gunji-Yoneoka et al. | |
| 2015/0380422 | A1 | 12/2015 | Sharangpani et al. | |
| 2016/0035742 | A1 | 2/2016 | Kanakamedala et al. | |
| 2016/0293617 | A1 | 10/2016 | Sharangpani et al. | |
| 2017/0236835 | A1 | 8/2017 | Nakamura et al. | |
| 2018/0122904 | A1 | 5/2018 | Matsumoto et al. | |
| 2018/0122905 | A1 | 5/2018 | Ogawa et al. | |
| 2018/0122906 | A1 | 5/2018 | Yu et al. | |
| 2018/0331117 | A1 | 11/2018 | Titus et al. | |
| 2018/0366486 | A1 | 12/2018 | Hada et al. | |
| 2018/0374866 | A1 | 12/2018 | Makala et al. | |
| 2019/0043830 | A1 | 2/2019 | Sakakibara et al. | |
| 2020/0006080 | A1 | 1/2020 | Osawa et al. | |
| 2022/0208600 | A1* | 6/2022 | Tirukkonda | H10B 43/40 |
| 2022/0208785 | A1 | 6/2022 | Titus et al. | |
| 2023/0143057 | A1* | 5/2023 | Hoang | H10B 51/20 257/295 |
| 2023/0290647 | A1* | 9/2023 | Wang | H10P 50/267 |

OTHER PUBLICATIONS

Chung, C.K. et al., "Reaction of Carbon and Silicon at High Temperature," Proceedings of the 3rd IEEE Int. Conf. on Nano/Micro Engineered and Molecular Systems, Jan. 6-9, 2008, Sanya, China.

Endoh et al., "Novel Ultra High-Density Memory with a Stacked-Surrounding Gate Transistor (S-SGT) Structured Cell," IEDM Proc. (2001) 33-36.

Hsu, C.C. et al., Etching of ruthenium coatings in $O_2$- and $Cl_2$-containing plasmas, Journal of Vacuum Science & Technology A, vol. 24, No. 1 (2006); https://doi.org/10.1116/1.2121751.

Kim, D. et al, "Profile simulation of high aspect ratio contact etch," Thin Solid Films, vol. 515, No. 12, pp. 4874-4878, (Apr. 2007); https://doi.org/10.1016/j.lsf.2006.10.023.

Lee, J.K. et al., "Mechanism of Sidewall Necking and Bowing in the Plasma Etching of High Aspect-Ratio Contact Holes," *Journal of The Electrochemical Society*, vol. 157, No. 3, D142, (2010); DOI :10.1149/1.3276511.

Morel, T. et al., "Tungsten metal gate etching in $Cl_2$/ $O_2$ inductively coupled high density plasmas," Journal of Vacuum Science & Technology B: Microelectronics and Nanometer Structures Processing, Measurement, and Phenomena, vol. 26, No. 1875, (2008); https://doi.org/10.1116/1.3002392.

Murdzek, J. A. et al., "Thermal atomic layer etching of amorphous and crystalline $Al_2O_3$ films," Journal of Vacuum Science & Technology A, vol. 39, 042602 (2021); https://doi.org/10.1116/6.0000935.

Singer, P. et al., "A New Hardmask Process, Saphira," https://sst.semiconductor-digest.com/2014/12/a-new-hardmask-process-saphira/ visited Dec. 29, 2020.

U.S. Appl. No. 17/355,955, filed Jun. 23, 2021, SanDisk Technologies LLC.

U.S. Appl. No. 17/494,114, filed Oct. 5, 2021, SanDisk Technologies LLC.

U.S. Appl. No. 17/508,036, filed Oct. 22, 2021, SanDisk Technologies LLC.

U.S. Appl. No. 17/590,278, filed Feb. 1, 2022, SanDisk Technologies LLC.

U.S. Appl. No. 17/657,521, filed Mar. 31, 2022, SanDisk Technologies LLC.

U.S. Appl. No. 18/151,662, filed Jan. 9, 2023, SanDisk Technologies LLC.

U.S. Appl. No. 18/346,504, filed Jul. 3, 2023, SanDisk Technologies LLC.

U.S. Appl. No. 18/357,702, filed Jul. 24, 2023, SanDisk Technologies LLC.

* cited by examiner

METHOD OF MAKING HIGH ASPECT RATIO OPENINGS USING MULTIPLE CLADDING MASKS AND APPARATUS FOR IMPLEMENTING THE SAME

FIELD

The present disclosure relates generally to the field of semiconductor devices, and particularly to a method of making high aspect ratio openings using multiple cladding masks and apparatus for implementing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method includes forming an alternating stack of first material layers and second material layers over a substrate, forming an etch mask material layer over the alternating stack, loading the etch mask material layer, the alternating stack, and the substrate into an integrated processing apparatus including a plurality of etch chambers and at least one cladding liner deposition chamber; and iteratively performing multiple instances of a unit processing sequence without breaking vacuum. The unit processing sequence includes a respective cladding liner deposition process in which a respective cladding material is anisotropically deposited over the etch mask material layer in a respective one of the at least one cladding liner deposition chamber, and a respective anisotropic etch process in which respective portions of the alternating stack that are not masked by the etch mask material layer are anisotropically etched in a respective etch chamber selected from the plurality of etch chambers.

According to another aspect of the present disclosure, an apparatus comprises: a plurality of etch chambers configured to anisotropically etch at least one etch-target material in a respective etch region selective to an etch mask material and selective to a cladding material by performing a respective reactive ion etch process therein; at least one cladding liner deposition chamber configured to anisotropically deposit the cladding material in a respective deposition region; a vacuum transfer chamber that is connected to each of the plurality of etch chambers and the at least one cladding liner deposition chamber; and a process controller configured to iteratively perform multiple instances of a unit processing sequence on a substrate, wherein the unit processing sequence comprises: a respective cladding liner deposition process in which the cladding material is anisotropically deposited over the substrate in a respective one of the at least one cladding liner deposition chamber, and a respective anisotropic etch process in which portions of the at least one etch-target material that are not masked by the etch mask material or the cladding material are anisotropically etched.

DETAILED DESCRIPTION

Figure 1:
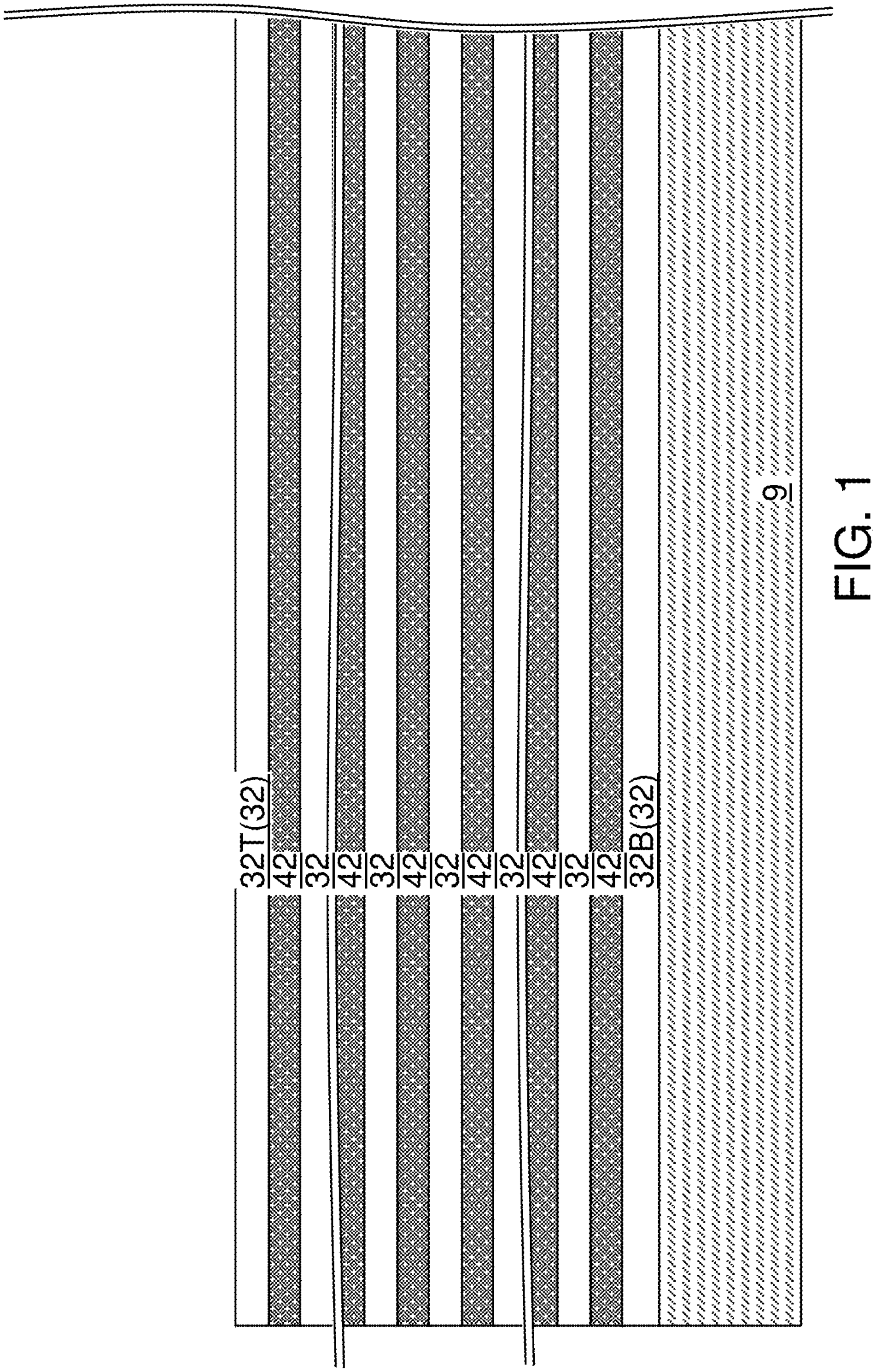
FIG. 1 is a schematic vertical cross-sectional view of an exemplary structure after formation of an alternating stack of insulating layers and sacrificial material layers according to an embodiment of the present disclosure.

As discussed above, the embodiments of the present disclosure are directed to a method of making high aspect ratio openings using multiple cladding masks and apparatus for implementing the same, the various aspects of which are described below. Embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated. The exemplary structure comprises a substrate 9, which may be a semiconductor substrate. For example, the substrate 9 may comprise a commercially available silicon wafer.

An alternating stack of first material layers and second material layers can be formed over the substrate 9. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the substrate 9. The insulating layers 32 comprise an insulating material such as undoped silicate glass or a doped silicate glass, and the sacrificial material layers 42 comprise a sacrificial material such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

While an embodiment is described in which the spacer material layers are formed as sacrificial material layers 42, the spacer material layers may be formed as electrically conductive layers in an alternative embodiment. Generally, spacer material layers may be formed as, or may be subsequently replaced at least partly with, electrically conductive layers.

Figure 2:
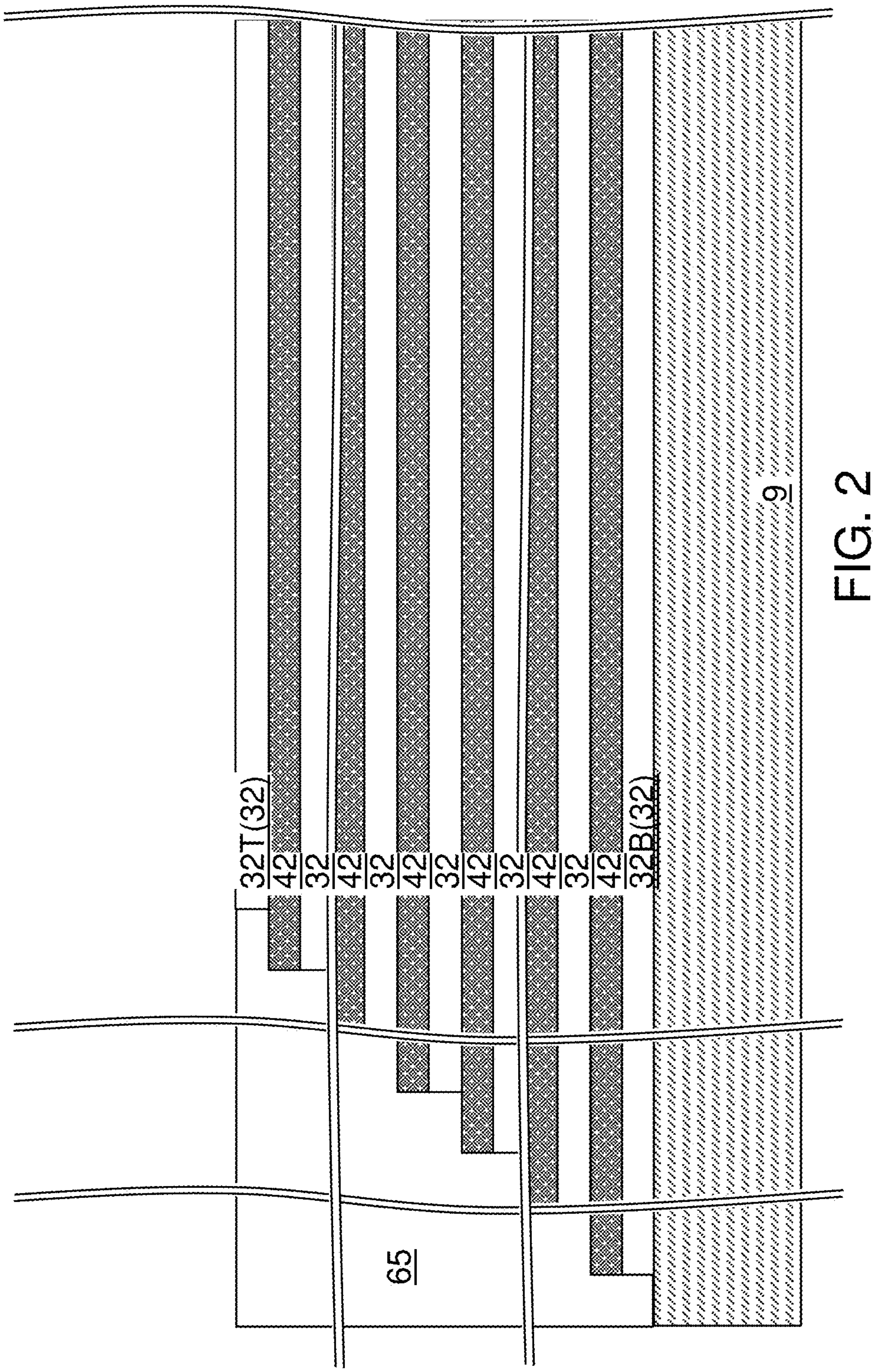
FIG. 2 is a schematic vertical cross-sectional view of the exemplary structure after formation of stepped terraces and a retro-stepped dielectric material portion according to an embodiment of the present disclosure.

Referring to FIG. 2, stepped surfaces may be formed by patterning one side of the alternating stack (32, 42). Another side of the alternating stack (32, 42) may be removed to provide a straight sidewall that extends from a bottommost surface to a topmost surface of the alternating stack (32, 42). A dielectric fill material such as undoped silicate glass or a doped silicate glass can be deposited over the alternating stack (32, 42), and excess portions of the dielectric fill material may be removed from above the horizontal plane including the top surface of the topmost insulating layer 32 by a planarization process, which may employ a chemical mechanical polishing process and/or a recess etch process. A retro-stepped dielectric material portion 65 may be formed over the stepped surfaces.

Figure 3A:
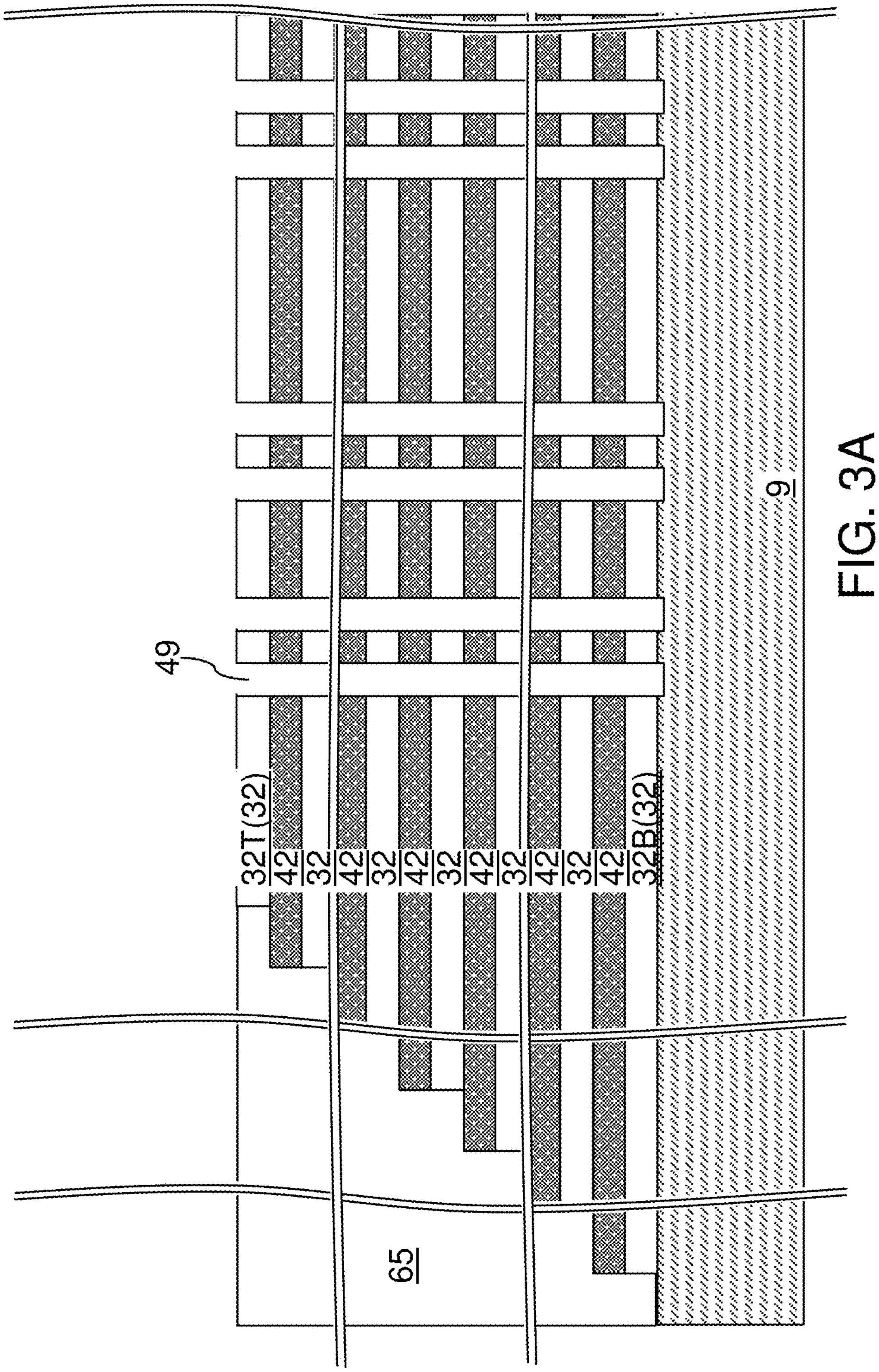
FIG. 3A is a schematic vertical cross-sectional view of the exemplary structure after formation of memory openings according to an embodiment of the present disclosure.
Figure 3B:
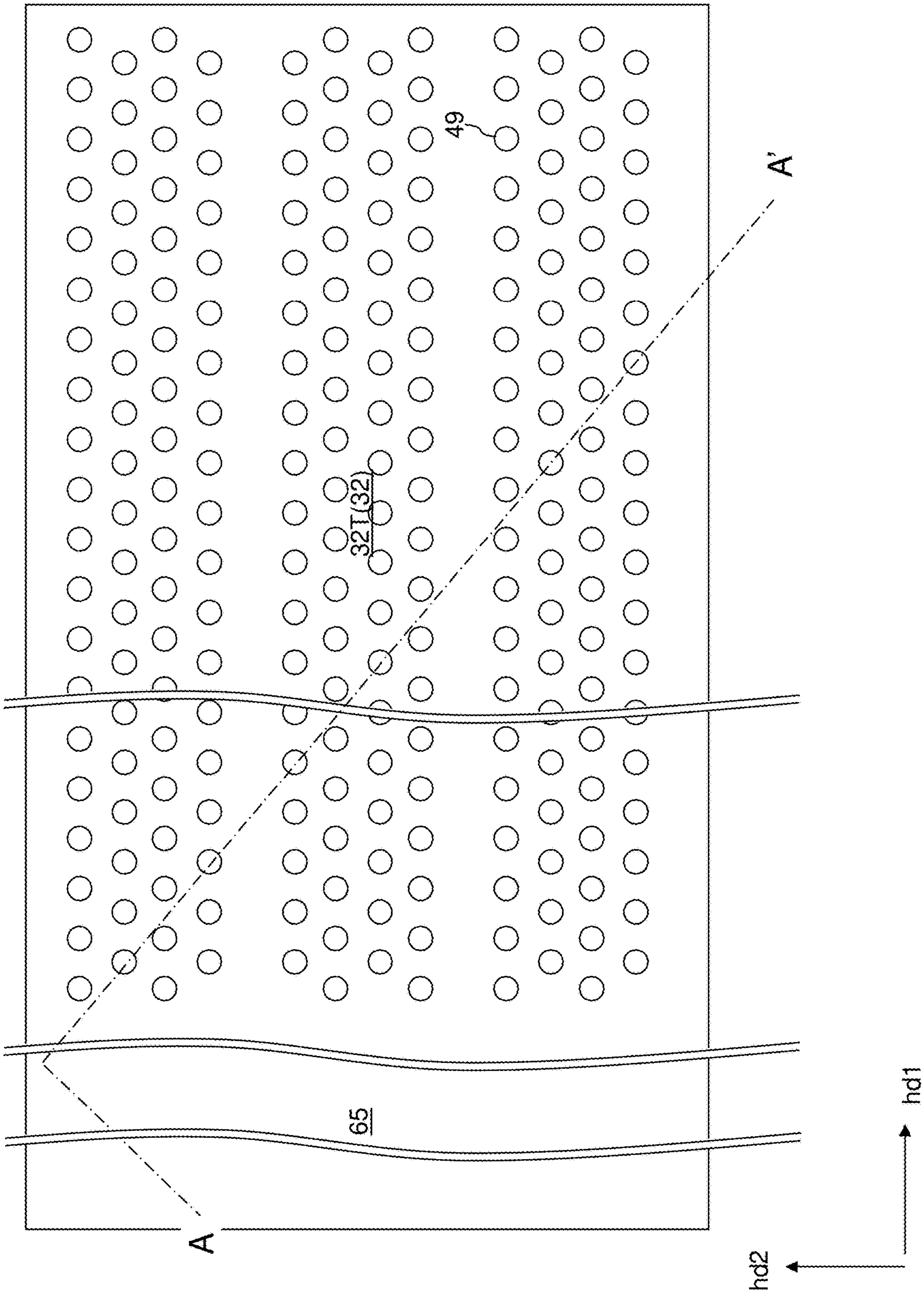
FIG. 3B is a top-down view of the exemplary structure of FIG. 3A. The vertical plane A-A' is the plane of the cross-section for FIG. 3A.

Referring to FIGS. 3A and 3B, an etch mask layer (not shown) can be formed over the alternating stack (32, 42), and can be lithographically patterned to form various openings therein. An anisotropic etch process can be performed to transfer the pattern of the openings in the etch mask layer through the alternating stack (32, 42). Various openings can be formed through the alternating stack (32, 42). The various openings may comprise memory openings 49 that vertically extend through each layer within the alternating stack (32, 42), and additional openings such as support openings (not illustrated) that are formed in the area of the retro-stepped dielectric material portion 65 and are subsequently employed to form support pillar structures. In one embodiment, the memory openings 49 may be formed in rows that laterally extend along a first horizontal direction hd1. The rows of memory openings 49 may be arranged along a second horizontal direction hd2 that is perpendicular to the first horizontal direction hd1. The etch mask layer can be subsequently removed.

FIGS. 4A-4I are sequential vertical cross-sectional views of a region of the exemplary structure during formation of the memory openings 49 according to an embodiment of the present disclosure. In other words, FIGS. 4A-4I illustrate a sequence of intermediate structures that are employed during processing steps that are performed on the exemplary structure illustrated in FIG. 2 until the exemplary structure illustrated in FIGS. 3A and 3B is formed. While a region in which two memory openings 49 are formed is illustrated in FIGS. 4A-4I, similar structural changes occur in each region of the exemplary structure of FIG. 2 in which any memory opening 49 or a support opening (not illustrated) is formed.

Figure 4A:
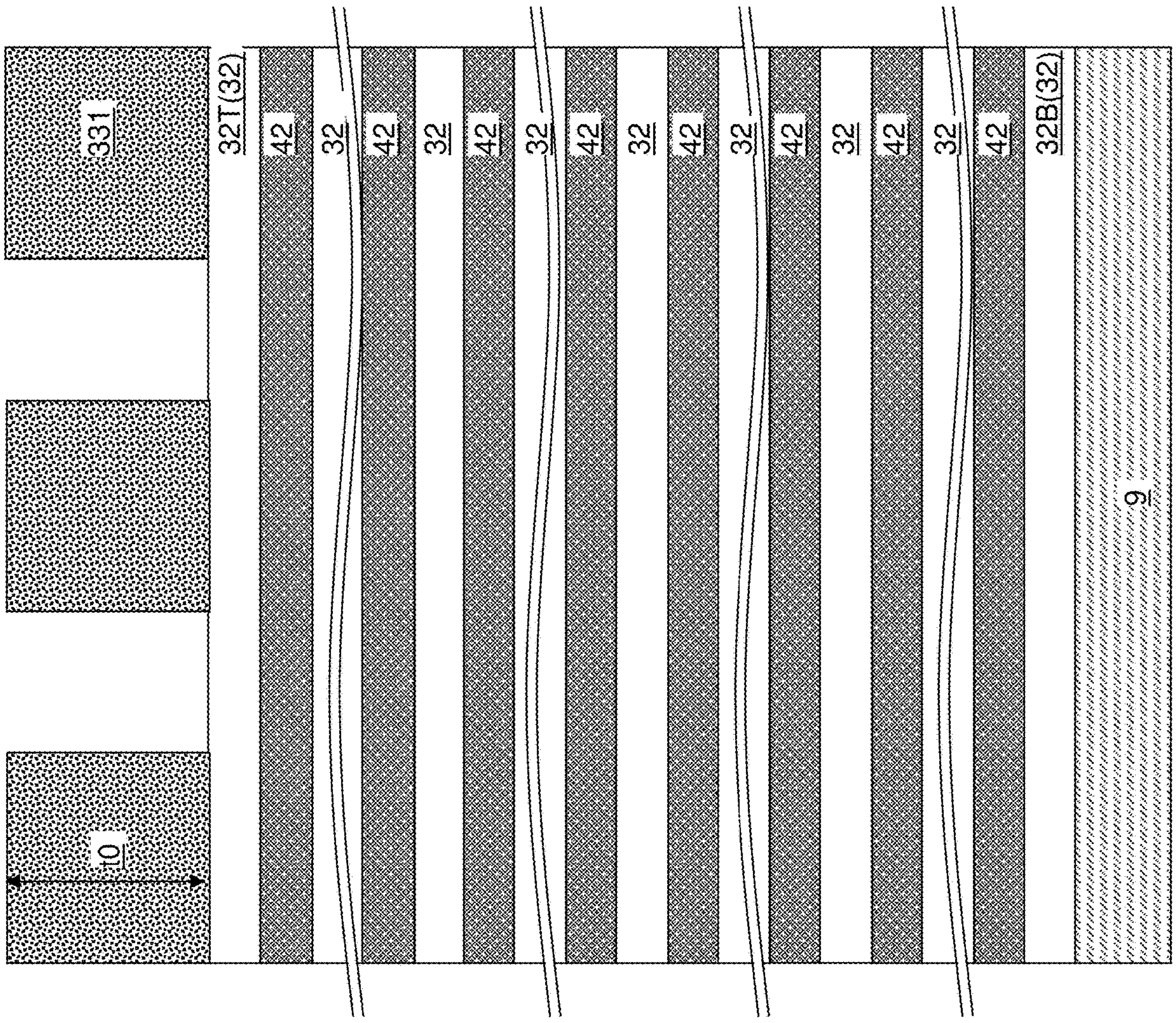
FIGS. 4A-4I are sequential vertical cross-sectional views of a region of the exemplary structure during formation of the memory openings according to an embodiment of the present disclosure.

Referring to FIG. 4A, a region of the exemplary structure is shown after formation of an etch mask material layer 331. Generally, an alternating stack of first material layers (such as the insulating layers 32) and second material layers (such as the sacrificial material layers 42) can be formed over the substrate 9. The etch mask material layer 331 can be subsequently formed over the alternating stack (32, 42) in a process chamber configured to deposit an etch mask material, i.e., in an etch mask deposition chamber. In one embodiment, the etch mask material layer 331 comprises and/or consists essentially of a carbon-based material comprising carbon atoms at a atomic concentration greater than 50%. In one embodiment, the etch mask material layer 331 may comprise at least 60 atomic percent carbon. For example, the etch mask material layer 331 may include amorphous carbon (such as a commercially available carbon-based mask material, such as Advanced Patterning Film™ provided by Applied Materials, Inc.) or another carbon material, such as diamond-like carbon, boron-doped carbon, or the like. In one embodiment, the total atomic percentage of carbon atoms and hydrogen atoms in the etch mask material layer 331 may be at least 80%, such as at least 90%, for example 80 to 100%. The etch mask material layer 331 may be deposited by a conformal or non-conformal deposition process. The initial thickness t0 of the etch mask material layer 331 may be in a range from 1 micron to 5 microns, such as 2 microns to 4 microns, although lesser and greater values may also be employed.

A photoresist layer (not shown) can be applied over the etch mask material layer 331, and can be lithographically patterned to form openings in a pattern that is the same as the pattern of the openings (which include the memory openings 49) illustrated in FIGS. 3A and 3B. Any suitable lithographic tool known in the art may be used to apply and pattern the photoresist layer. The pattern in the photoresist layer can be transferred through the etch mask material layer 331 by performing an anisotropic etch process, which is herein referred to as a hard-mask-open etch process. Openings can be formed in the etch mask material layer 331 by the hard-mask-open etch process, which transfers the pattern of the openings in the photoresist layer through the etch mask material layer 331. A segment of a topmost surface of the alternating stack (32, 42) can be physically exposed at the bottom of each opening through the etch mask material layer 331. The hard-mask-open etch process may be performed in a process chamber configured to perform a reactive ion etch process, i.e., in a reactive ion etch chamber. The aspect ratio of each opening in the etch mask material layer 331 may be greater than 2, and/or greater than 3, and/or greater than 4, such as 5 to 20.

According to an aspect of the present disclosure, the processing steps described with reference to FIGS. 4B-4H may be performed employing an integrated processing apparatus 500, such as an integrated etch-and-cladding apparatus, according to embodiments of the present disclosure. FIG. 5A is a first exemplary apparatus 500A for performing the processing steps described with reference to FIGS. 4B-4H according to an embodiment of the present disclosure. FIG. 5B is a second exemplary apparatus 500B for performing the processing steps described with reference to FIGS. 4B-4H according to an alternative embodiment of the present disclosure. The integrated etch-and-cladding apparatus 500 comprises a vacuum cluster tool in which the processing steps described with reference to FIGS. 4B-4H are performed without breaking vacuum.

Referring collectively to FIGS. 5A and 5B, alternative embodiments of the integrated processing apparatus 500 (i.e., 500A and/or 500B) that can be employed to perform the processing steps of FIGS. 4B-4H are illustrated. Each embodiment of the integrated processing apparatus 500 comprises a vacuum transfer chamber 510 that defines a boundary (i.e., walls) of a vacuum enclosure 509 and functions as a frame for connecting multiple process chambers (530, 540), which may comprise vacuum chambers. The multiple process chambers (530, 540) comprise a plurality of etch chambers 530 configured to anisotropically etch at least one etch-target material in a respective etch region selective to an etch mask material and selective to a cladding material by performing a respective ion etch process, such as a reactive ion etch process or an ion beam etch process therein. In one embodiment, each of the plurality of etch chambers 530 may be configured to perform a respective ion etch process having a same ion etchant (e.g., the same etch chemistry during a reactive ion etch).

The etch-target material is the material that is etched by the ions of the ion etch process, and the etch mask material and the cladding material are materials that are more resistant to etching of ion etch process than the etch-target material. In one embodiment, the etch-target material may comprise the alternating stack (32, 42) of insulating layers 32 and the sacrificial material layers 42. The etch mask material may be the material of the etch mask layer 331 described above. The cladding material may be a material providing a higher etch resistivity to the anisotropic etch process than the etch mask material, as will be described in more detail below.

The multiple process chambers (530, 540) further comprise at least one cladding liner deposition chamber 540 configured to anisotropically deposit a cladding material in a respective deposition region. In one embodiment, each of the at least one cladding liner deposition chamber 540 may comprises a physical vapor deposition, chemical vapor deposition or ion beam deposition chamber.

In one embodiment, the at least one cladding liner deposition chamber 540 comprises a physical vapor deposition chamber, such as a sputtering chamber or an ion beam deposition chamber, that is configured to deposit the cladding material under vacuum at a pressure lower than 1.0×$10^{-4}$ Pa, and/or lower than 1.0×$10^{-6}$ Pa, and/or lower than 1.0×$10^{-7}$ Pa (i.e., an ultrahigh vacuum range). The cladding material that can be sputtered or ion beam deposited in a physical vapor deposition process may comprise an elemental metal, a metal nitride material, a carbide material, or an insulating material, such as an insulating metal oxide material. In one embodiment, the cladding material may comprise a conductive material, such as tungsten, tantalum, titanium, molybdenum, niobium, ruthenium, tungsten nitride, tantalum nitride, titanium nitride, molybdenum nitride, etc., or a semiconductor material, such as silicon carbide, or an insulating material, such as aluminum oxide. The cladding material may be provided in one or more sputtering targets or ion beam deposition targets in the cladding liner deposition chamber 540. In one embodiment, the chamber 540 may comprise a reactive or non-reactive sputtering chamber, such as a DC magnetron sputtering chamber which uses a plasma (e.g., argon plasma) for sputtering. In another embodiment, the chamber 540 may comprise an ion beam deposition chamber (e.g., ion beam sputtering chamber) in which there is no plasma between the substrate and the target, and a noble gas (e.g., argon or xenon) ion beam is used to sputter the target material toward the substrate.

Alternatively, the anisotropic deposition process for depositing the cladding material may comprise a selective vapor deposition process that grows the cladding material from physically exposed surfaces of the etch mask material without growth of the cladding material from physically exposed surfaces of the alternating stack (32, 42). The anisotropic deposition process may comprise a conformal selective vapor deposition process, such as a chemical vapor deposition (CVD) process or an atomic layer deposition (ALD) process. In an illustrative example, the cladding material may comprise an insulating or semiconductor material, such as diamond-like carbon, amorphous silicon, polycrystalline silicon, silicon oxide or boron nitride. In another embodiment, the cladding material comprises and/or consists essentially of a conductive material that can be selectively deposited on surfaces of the etch mask layer, such as tungsten. In this embodiment, the at least one cladding liner deposition chamber 540 comprises a CVD or an ALD chamber.

Each of the plurality of etch chambers 530 and the at least one cladding liner deposition chamber 540 can be connected to a respective opening in the vacuum transfer chamber 510. Vacuum valves (not shown) may be provided between the vacuum transfer chamber 510 and each of the plurality of etch chambers 530 and the at least one cladding liner deposition chamber 540 to isolate the processing environment of each of the plurality of etch chambers 530 and the at least one cladding liner deposition chamber 540 from the vacuum environment in the vacuum transfer chamber 510, i.e., from the environment of the vacuum enclosure 509. At least one vacuum pump (not shown) can be connected to each of the vacuum transfer chamber 510, the plurality of etch chambers 530, and the at least one cladding liner deposition chamber 540.

The integrated processing apparatus 500 comprises at least one transfer robot 550 that can be utilized to transfer substrates, which may include a substrate 9 containing the exemplary structure (e.g., the alternating stack (32, 42)) illustrated in FIG. 4A or any of the exemplary structures illustrated in FIGS. 4A-4I. Each transfer robot 550 may comprise a robot frame 552 that is located within the vacuum transfer chamber 510. The robot frame 552 may be stationary, may be configured to rotate around a fixed axis (e.g., as shown in FIG. 5B), or may be configured to provide a translation motion along a track 560 (e.g., as shown in FIG. 5A) in the vacuum transfer chamber 510. Each transfer robot 550 may also comprise at least one robot arm 554 configured to extend into, transfer a substrate into and out of, each of the multiple process chambers (530, 540) of the integrated processing apparatus 500. A transfer assist element 556, such as a wafer carrying blade and/or wafer clamps (e.g., clamp fingers) may be attached to an end portion of each robot arm 554. In some embodiments, a pair of robot arms 554 may be attached to a transfer assist element.

In one embodiment, the integrated processing apparatus 500 may comprise at least one loadlock 520 attached to the vacuum transfer chamber 510. The at least one loadlock 520 may comprise a plurality of loadlocks 520 or a single loadlock 520. Generally, a cassette or a pod including a plurality of substrates can be located into a first loadlock 520, and the plurality of substates can be sequentially transferred out of the first loadlock 520 and into a selected subset of the multiple processing chambers (530, 540) of the integrated processing apparatus 500 by the at least one robot arm 554 to perform a series of processing steps, and the plurality of substrates can be transferred into a second loadlock 520, and then can be subsequently unloaded out of the second loadlock 520. The second loadlock 520 may be the same as or may be different from the first loadlock 520.

The integrated processing apparatus 500 may comprise a process controller 580 configured to iteratively perform multiple instances of a unit processing sequence on each substrate. Generally, the process controller 580 comprises a computer or special purpose ASIC including a processor unit and a memory in communication with the processor unit, and is loaded with an automated program to operate various other components of the integrated processing apparatus 500 to execute the multiple instance of the unit processing sequence on each substrate. According to an aspect of the present disclosure, the unit processing sequence comprises: (1) a respective cladding liner deposition process in which the cladding material is anisotropically deposited over the substrate in a respective one of the at least one cladding liner deposition chamber 540, and (2) a respective anisotropic etch process in which portions of the at least one etch-target material that are not masked by the etch mask material or the cladding material are anisotropically etched in a respective one of the plurality of etch chambers 530. In one embodiment, the multiple instances of the unit processing sequence comprises N instances of the unit processing sequence in which N is an integer greater than 1. The number N may be, for example, 2, 3, 4, 5, 6, 7, 8, etc.

Generally speaking, the anisotropic etch processes performed in the plurality of etch chambers 530 tend to take a longer time than the cladding liner deposition processes performed in each cladding liner deposition chamber 540. In some embodiments, the total number of the cladding liner deposition chambers 540 in the integrated processing apparatus 500 may be less than N. In this case, the process controller 580 is configured to perform a plurality of cladding liner deposition processes in the same one of the cladding liner deposition chambers 540, while the anisotropic etch process are performed in plurality of the etch chambers 530. In other words, a substrate can be transferred into a cladding liner deposition chamber 540 to perform a first cladding liner deposition process, then can be subsequently transferred into at least one etch chamber 530 to perform at least one anisotropic etch processes, and then can be transferred into the same cladding liner deposition chamber 540 to perform a second cladding liner deposition process, and then can be transferred into the same or a different etch chamber 530 to perform another anisotropic etch process. Thus, a same cladding liner deposition chamber 540 may be used at least twice during a sequence of processing steps performed on a substrate.

In one embodiment, each of the anisotropic etch processes has a respective time duration that is at least two times longer than each of the cladding liner deposition processes. In this case, a ratio of the total number of etch chambers 530 within the plurality of etch chambers 530 to the total chamber number of the at least one cladding liner deposition chamber 540 may be in a range from 2 to 10.

Figure 4B:
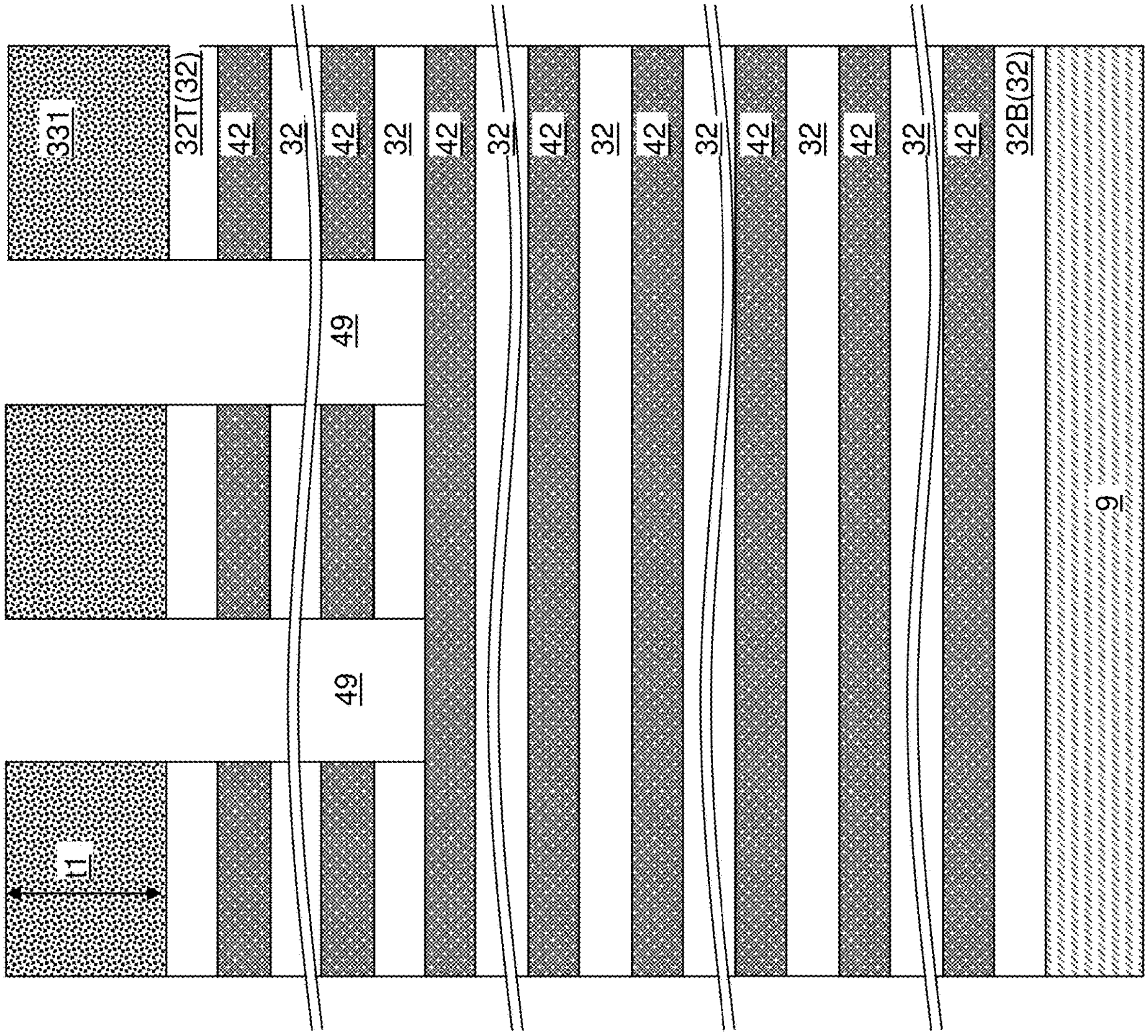
Figure 5A:
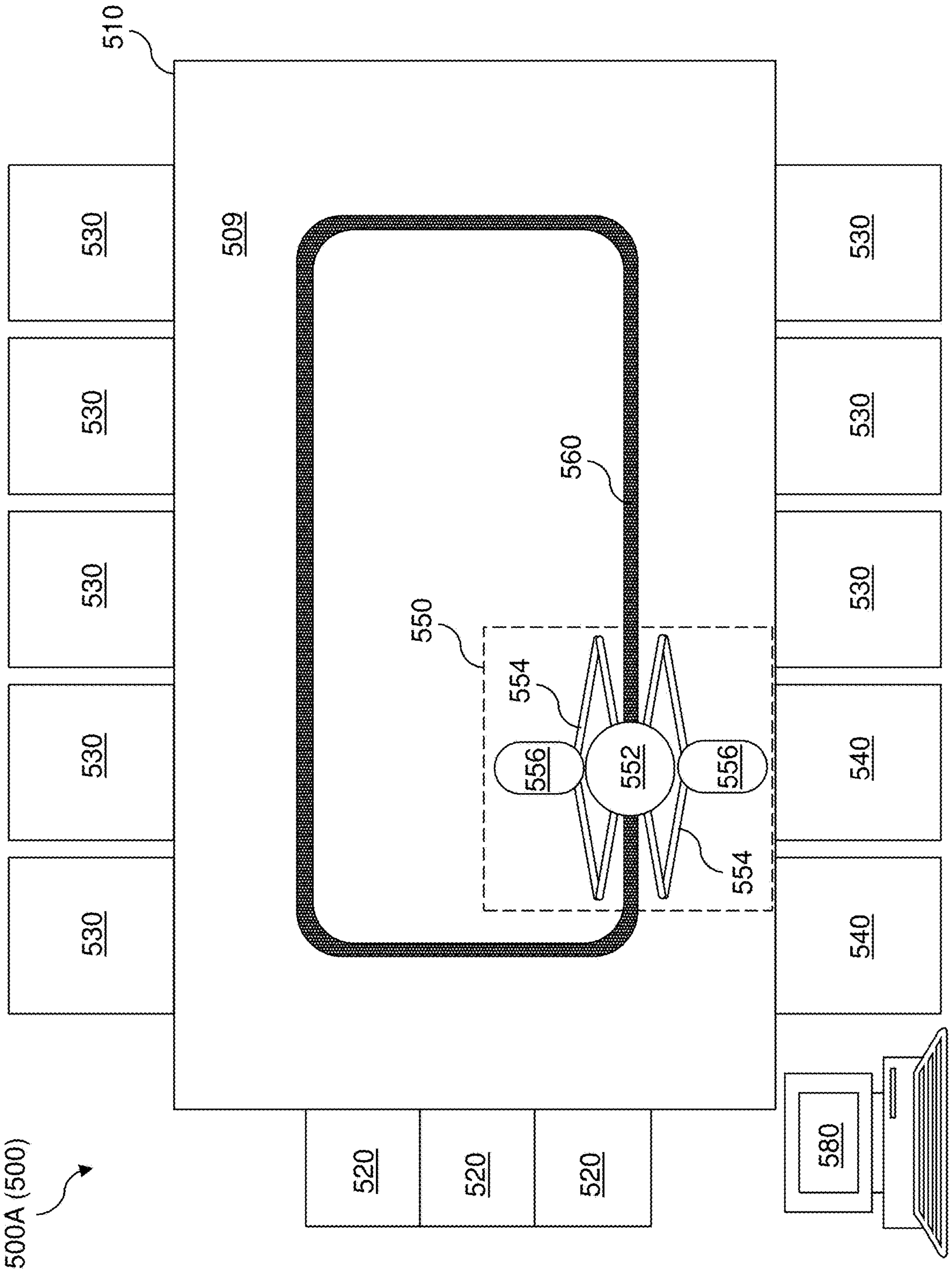
FIG. 5A is a first exemplary apparatus for performing the processing steps described with reference to FIGS. 4B-4H according to an embodiment of the present disclosure.
Figure 5B:
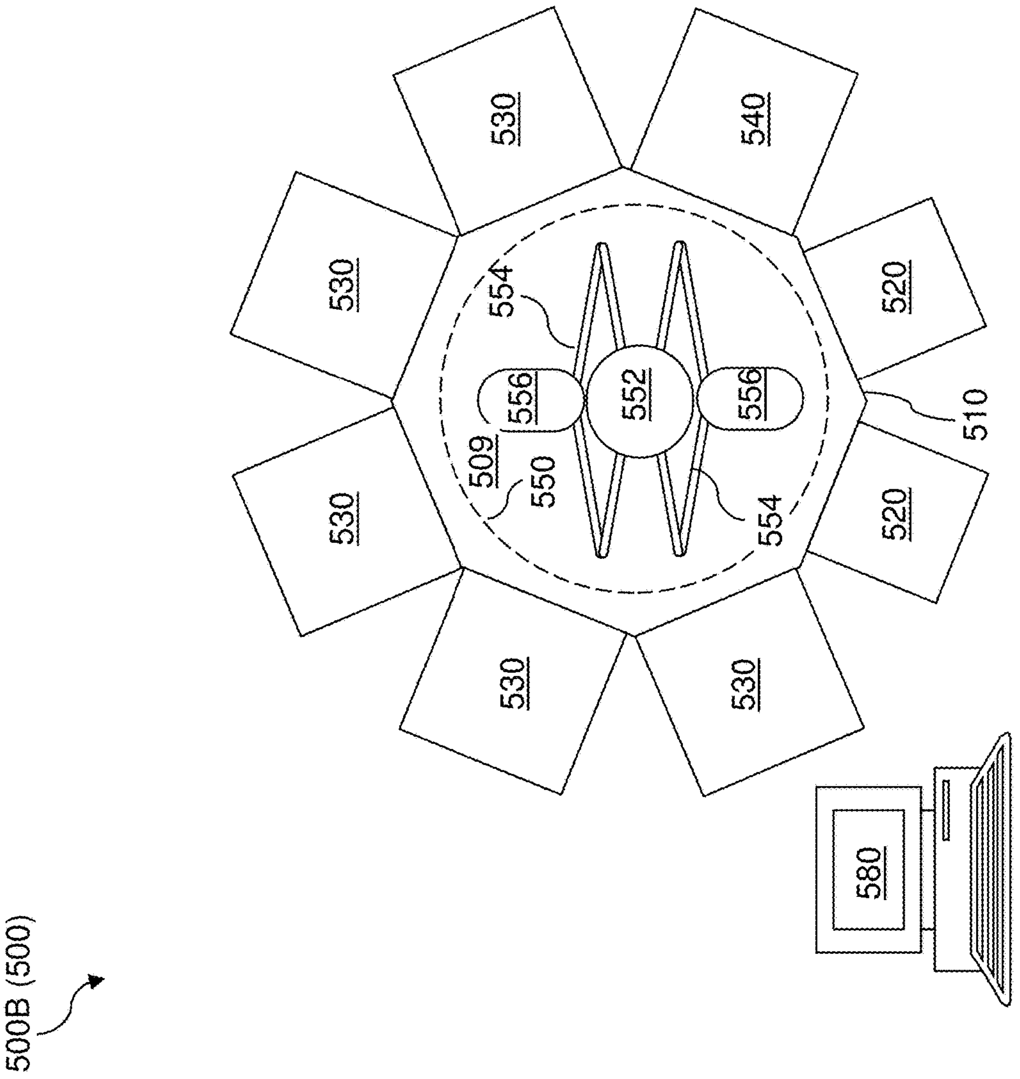
FIG. 5B is a second exemplary apparatus for performing the processing steps described with reference to FIGS. 4B-4H according to another embodiment of the present disclosure.

Referring to FIGS. 4B, 5A, and 5B, the exemplary structure described with reference to FIG. 4A can be loaded into a loadlock 520 of an integrated processing apparatus 500 (e.g., 500A or 500B). Generally, an assembly comprising an etch mask material layer 331, an alternating stack (32, 42), and the substrate 9 can be loaded into an integrated processing apparatus 500 including a plurality of etch chambers 530 and at least one cladding liner deposition chamber 540.

The exemplary structure can be transferred into one of the etch chambers 530, and an anisotropic etch process can be performed to etch unmasked upper portions of the alternating stack (32, 42) that are not masked by the etch mask material layer 331. This anisotropic etch process can be performed prior to depositing any cladding material on the etch mask material layer 331, and is herein referred to as an initial anisotropic etch process. The initial anisotropic etch process may comprise a reactive ion etch process. The etch chemistry of the initial anisotropic etch process can be selected to etch the materials of the first material layers (such as the insulating layers 32) and the second material layers (such as the sacrificial material layers 42) of the alternating stack (32, 42). In one embodiment, the etch chemistry of the initial anisotropic etch process may be temporally modulated (i.e., may vary as a function of time) with a periodicity so that a first material layer is etched selective to an underlying second material layer, and subsequently a second material layer is etched selected to an underlying first material layer, etc. An opening, such as a memory opening 49 or a support opening, can be formed underneath each opening in the etch mask material layer 331.

In an illustrative example, the first material layers (such as the insulating layers 32) comprise silicon oxide layers, the second material layers (such as the sacrificial material layers 42) comprise silicon nitride layers, and the reactive ion etch process of the initial anisotropic etch process may employ at least one respective etchant gas selected from fluorocarbon gases, hydrofluorocarbon gases, fluorochlorocarbon gases, nitrogen trifuoride gas, or sulfur hexafluoride gas. For example, at least one etchant gas such as $CF_4$, $C_4F_8$ and/or $CF_2Br_2$ may be employed in combination with $O_2$ and/or Ar. The reactive ion etch process generates a plasma to etch the layers of the alternating stack. The number of layers of the alternating stack (32, 42) that is etched during the initial anisotropic etch process may be in a range from 5% to 50%, such as from 10% to 40%, of the total number of layers within the alternating stack (32, 42). The thickness of the etch mask material layer 331 after the initial anisotropic etch process is less than the initial thickness t0, and is herein referred to as a first thickness t1. In one embodiment, t0 equals to t1, if the etch mask material layer 331 thickness is not reduced during the initial anisotropic etch process. In another embodiment, t0 is greater than t1 if the etch mask material layer 331 thickness is reduced during the initial anisotropic etch process. In this embodiment, the first thickness t1 may be in a range from 0.7 micron to 4 microns, such as 0.8 microns to 2 microns although lesser and greater values may also be employed.

Figure 4C:
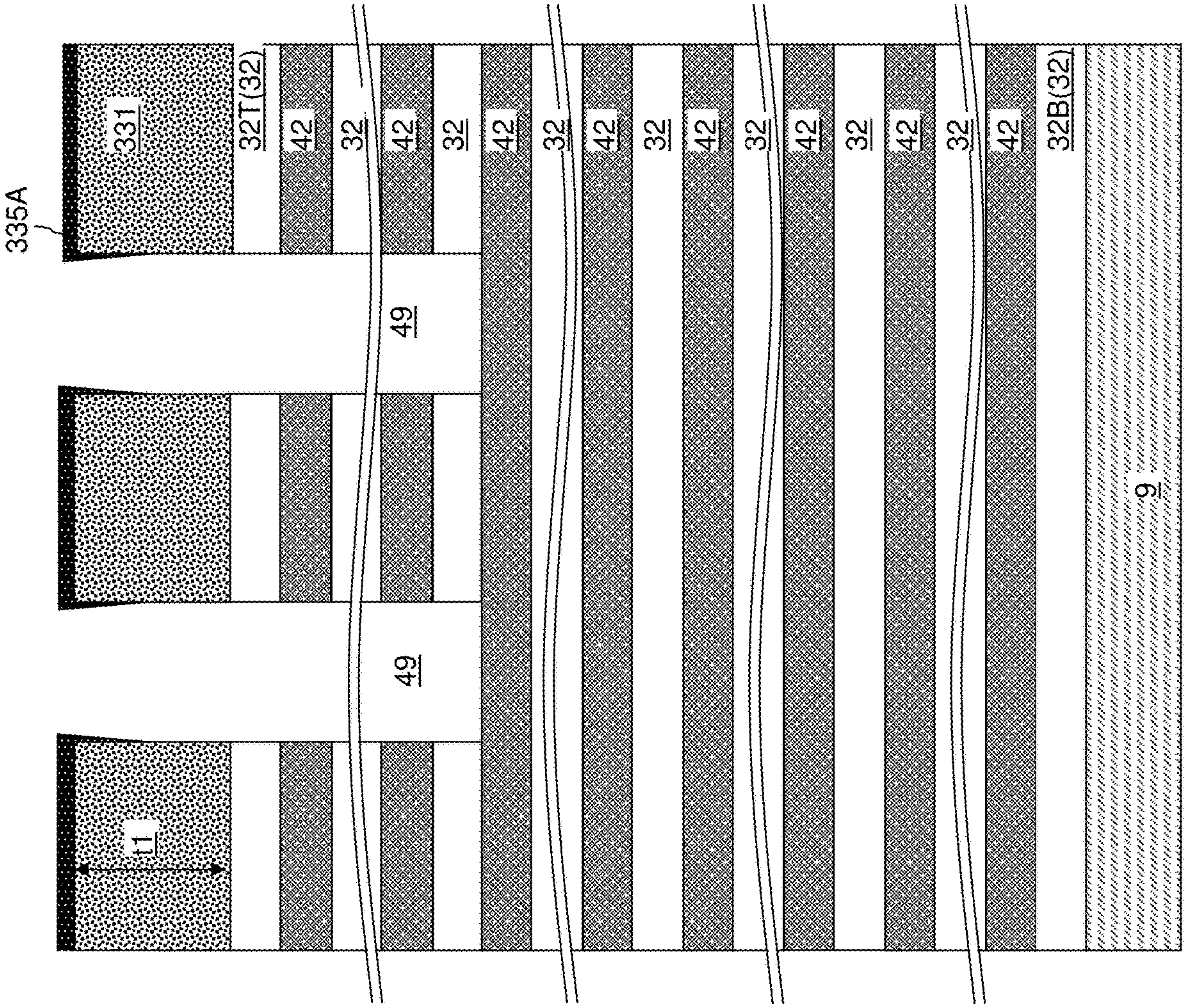
Figure 4D:
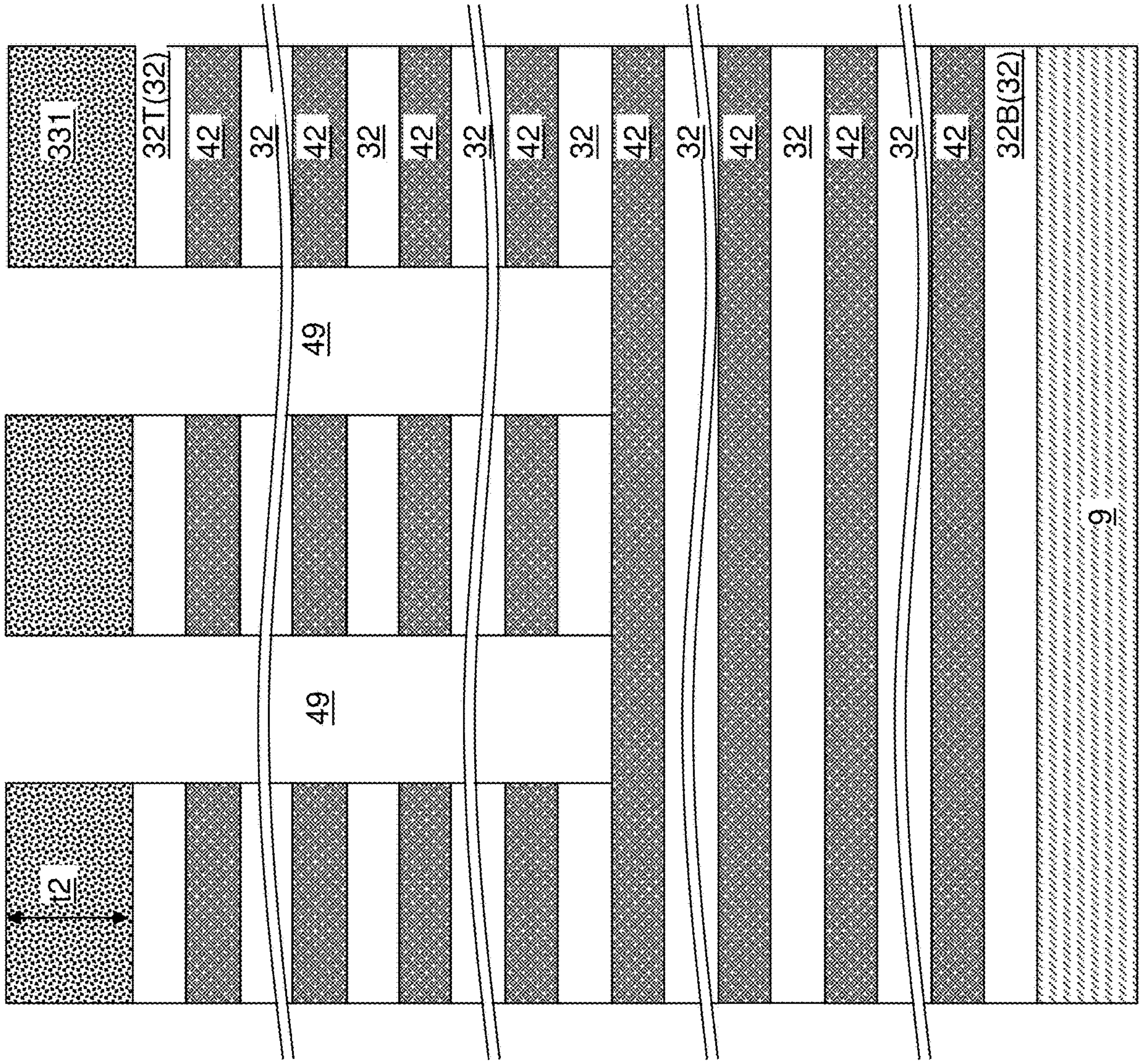
Figure 4E:
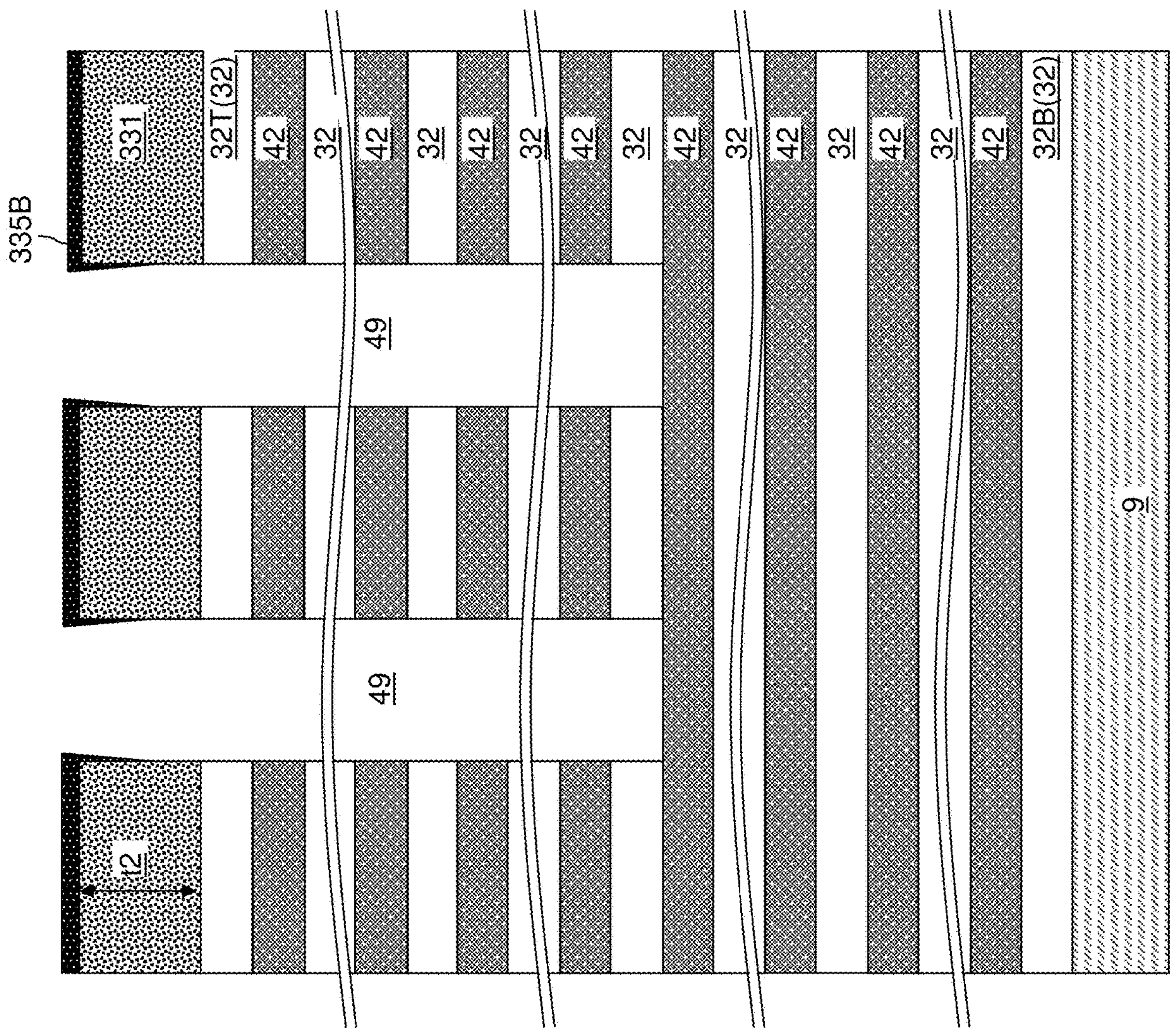
Figure 4F:
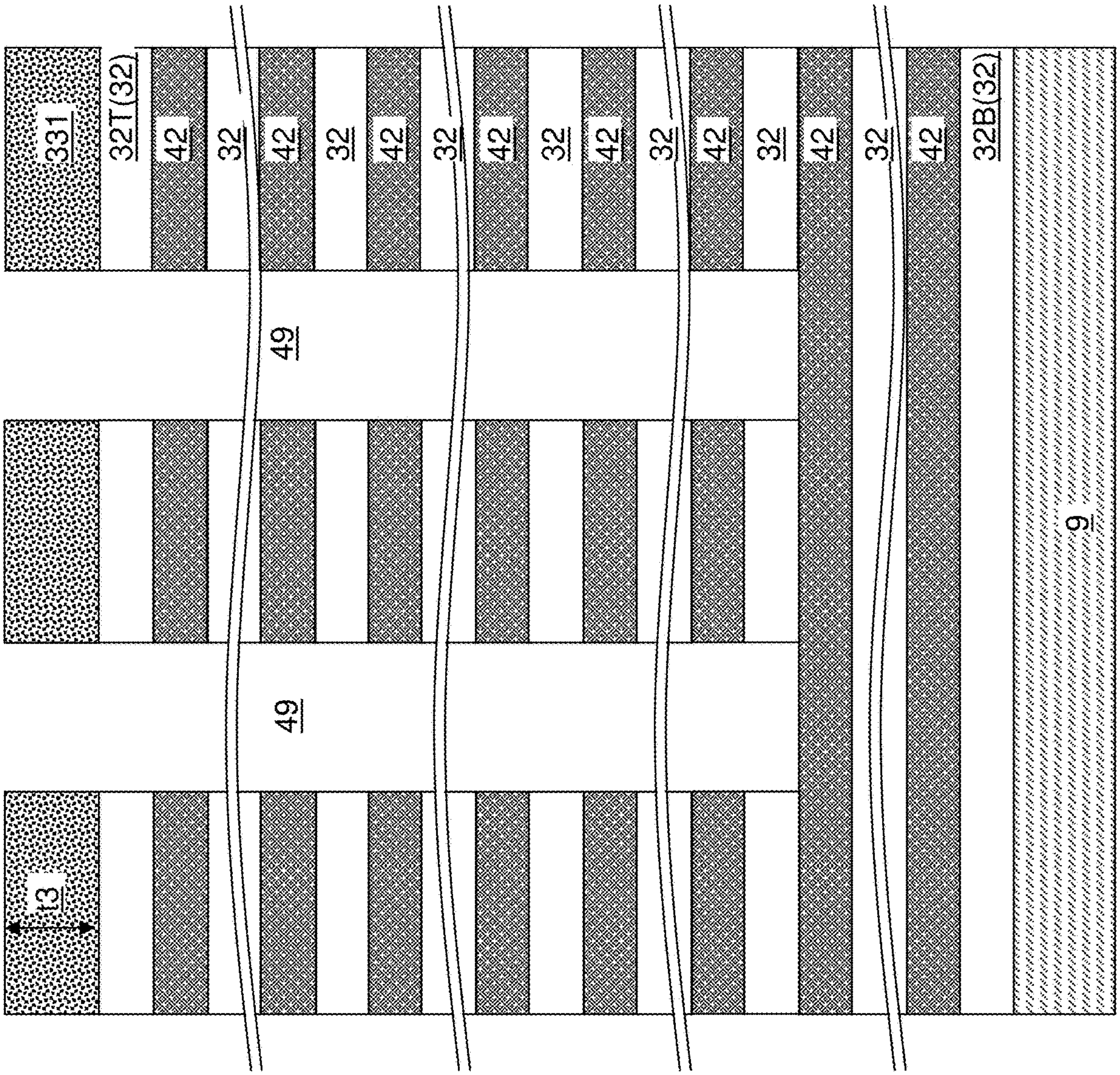

Referring collectively to FIGS. 4C-4H, 5A, and 5B, multiple instances of a unit processing sequence can be performed sequentially. The unit processing sequence comprises a respective cladding liner deposition process (described with reference to FIGS. 4C, 4E, and 4G) and a respective anisotropic etch process (described with reference to FIGS. 4D, 4F, and 4H). FIGS. 4C and 4D describe a first instance of the unit processing sequence; FIGS. 4E and 4F describe a second instance of the unit processing sequence; and FIGS. 4G and 4H describe a third instance of the unit processing sequence. Generally, N repetitions of the unit processing sequence can be repeated according embodiments of the present disclosure. While an embodiment is described in which N is 3, other embodiments are expressly contemplated herein in which the integer N is any positive integer greater than 1, such as 2, 4, 5, 6, 7, 8, etc.

A respective cladding material is anisotropically deposited over the etch mask material layer 331 in a respective cladding liner deposition chamber 540 during each cladding liner deposition process within the multiple instances of the unit processing sequence. Respective portions of the alternating stack (32, 42) that are not masked by the etch mask material layer 331 are anisotropically etched in a respective etch chamber 530 selected from the plurality of etch chambers 530 during each anisotropic etch process within the multiple instances of the unit processing sequence.

Referring to FIGS. 4C, 5A, and 5B, the exemplary structure (which includes the substrate 9) can be transferred from the etch chamber 530 in which the initial anisotropic etch process is performed, through the vacuum transfer chamber 510, into a cladding liner deposition chamber 540. A cladding liner deposition process within the first instance of the unit processing sequence can be performed to deposit a first cladding liner 335A on the etch mask material layer 331. The cladding liner deposition process is an anisotropic deposition process, which may comprise a directional deposition process (such as a physical vapor deposition process) or a selective deposition process (such as a selective vapor growth process). The first cladding liner 335A comprises a first cladding material, which may be any of the cladding materials discussed above. The vertical thickness of a horizontally-extending portion of the first cladding liner 335A that overlie the top surface of the etch mask material layer 331 may be in a range from 5 nm to 150 nm, such as from 20 nm to 50 nm, although lesser and greater thicknesses may also be employed.

Referring to FIGS. 4D, 5A, and 5B, the exemplary structure can be transferred from the cladding liner deposition chamber 540 which was used to deposit the first cladding liner 335A, through the vacuum transfer chamber 510, into an etch chamber 530. An anisotropic etch process within the first instance of the unit processing sequence can be performed to etch unmasked upper portions of the alternating stack (32, 42) that are not masked by the combination of the etch mask material layer 331 and the first cladding liner 335A. This anisotropic etch process is performed after formation of the first cladding liner 335A on the etch mask material layer 331. The anisotropic etch process may comprise a reactive ion etch process. The etch chemistry of the anisotropic etch process can be selected to etch the materials of the first material layers (such as the insulating layers 32) and the second material layers (such as the sacrificial material layers 42) of the alternating stack (32, 42). In one embodiment, the etch chemistry of the anisotropic etch process may be temporally modulated (i.e., may vary as a function of time) with a periodicity so that a first material layer is etched selective to an underlying second material layer, and subsequently a second material layer is etched selected to an underlying first material layer, etc. Each opening, such as a memory opening 49 or a support opening, can be vertically extended through a subset of the layers in the alternating stack (32, 42) underneath each opening in the etch mask material layer 331.

In an illustrative example, the first material layers (such as the insulating layers 32) comprise silicon oxide layers, the second material layers (such as the sacrificial material layers 42) comprise silicon nitride layers, and the reactive ion etch process of the anisotropic etch process may employ at least one respective etchant gas selected from fluorocarbon gases, hydrofluorocarbon gases, fluorochlorocarbon gases, nitrogen trifuoride gas, and sulfur hexafluoride gas. For example, at least one etchant gas such as $CF_4$, $C_4F_8$ and/or $CF_2Br_2$ may be employed in combination with $O_2$ and/or Ar. The number of layers of the alternating stack (32, 42) that is etched during the anisotropic etch process in the first instance of the unit processing sequence may be in a range from 5% to 50%, such as from 10% to 40%, of the total number of layers within the alternating stack (32, 42). In one embodiment, the entirety of the first cladding liner 335A can be removed before termination of the anisotropic etch process in the first instance of the unit processing sequence. The thickness of the etch mask material layer 331 after the anisotropic etch process in the first instance of the unit processing sequence may be the same as or may be less than the first thickness t1, and is herein referred to as a second thickness t2. The second thickness t2 may be in a range from 0.6 micron to 5 microns, such as 0.7 microns to 2 microns although lesser and greater values may also be employed.

Referring to FIGS. 4E, 5A, and 5B, the exemplary structure (which includes the substrate 9) can be transferred from the etch chamber 530 in which the anisotropic etch process in the first instance of the unit processing sequence was performed, through the vacuum transfer chamber 510, into a cladding liner deposition chamber 540 (e.g., the same chamber 540 or a different chamber 540 than described before). A cladding liner deposition process within the second instance of the unit processing sequence can be performed to deposit a second cladding liner 335B on the etch mask material layer 331. The cladding liner deposition process is an anisotropic deposition process, and may be the same process as the cladding liner deposition process described with reference to FIG. 4C. The vertical thickness of a horizontally-extending portion of the second cladding liner 335B that overlie the top surface of the etch mask material layer 331 may be in a range from 5 nm to 150 nm, such as from 20 nm to 50 nm, although lesser and greater thicknesses may also be employed.

Referring to FIGS. 4F, 5A, and 5B, the exemplary structure can be transferred from the cladding liner deposition chamber 540 used to deposit the second cladding liner 335B, through the vacuum transfer chamber 510, into an etch chamber 530. An anisotropic etch process within the second instance of the unit processing sequence can be performed to etch unmasked upper portions of the alternating stack (32, 42) that are not masked by the combination of the etch mask material layer 331 and the second cladding liner 335B. The anisotropic etch process within the second instance of the unit processing sequence may be the same as the anisotropic etch process within the first instance of the unit processing sequence. Each opening, such as a memory opening 49 or a support opening, can be vertically extended through a subset of the layers in the alternating stack (32, 42) underneath each opening in the etch mask material layer 331.

The second cladding liner 335B may be consumed during the anisotropic etch process within the second instance of the unit processing sequence. The thickness of the etch mask material layer 331 after the anisotropic etch process in the second instance of the unit processing sequence may be the same as or may be less than the second thickness t2, and is herein referred to as a third thickness t3. The third thickness t3 may be in a range from 0.5 micron to 5 microns, such as 0.6 microns to 1.6 microns although lesser and greater values may also be employed.

Figure 4G:
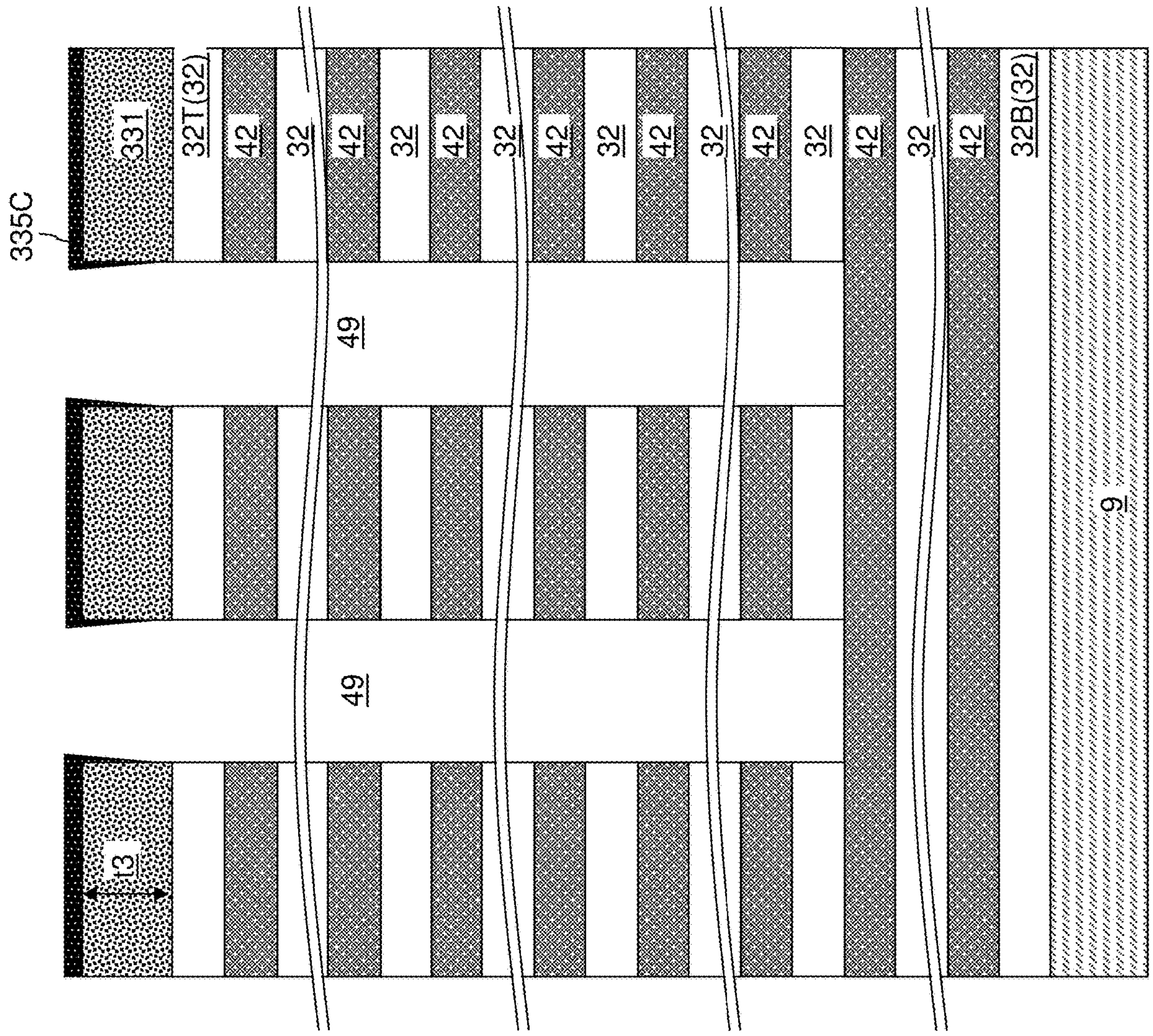

Referring to FIGS. 4G, 5A, and 5B, the exemplary structure (which includes the substrate 9) can be transferred from the etch chamber 530 in which the anisotropic etch process in the second instance of the unit processing sequence was performed, through the vacuum transfer chamber 510, into a cladding liner deposition chamber 540. A cladding liner deposition process within the third instance of the unit processing sequence can be performed to deposit a third cladding liner 335C on the etch mask material layer 331. The cladding liner deposition process is an anisotropic deposition process, and may be the same process as the cladding liner deposition process described with reference to FIG. 4C. The vertical thickness of a horizontally-extending portion of the third cladding liner 335C that overlie the top surface of the etch mask material layer 331 may be in a range from 5 nm to 150 nm, such as from 5 nm to 50 nm, although lesser and greater thicknesses may also be employed.

Figure 4H:
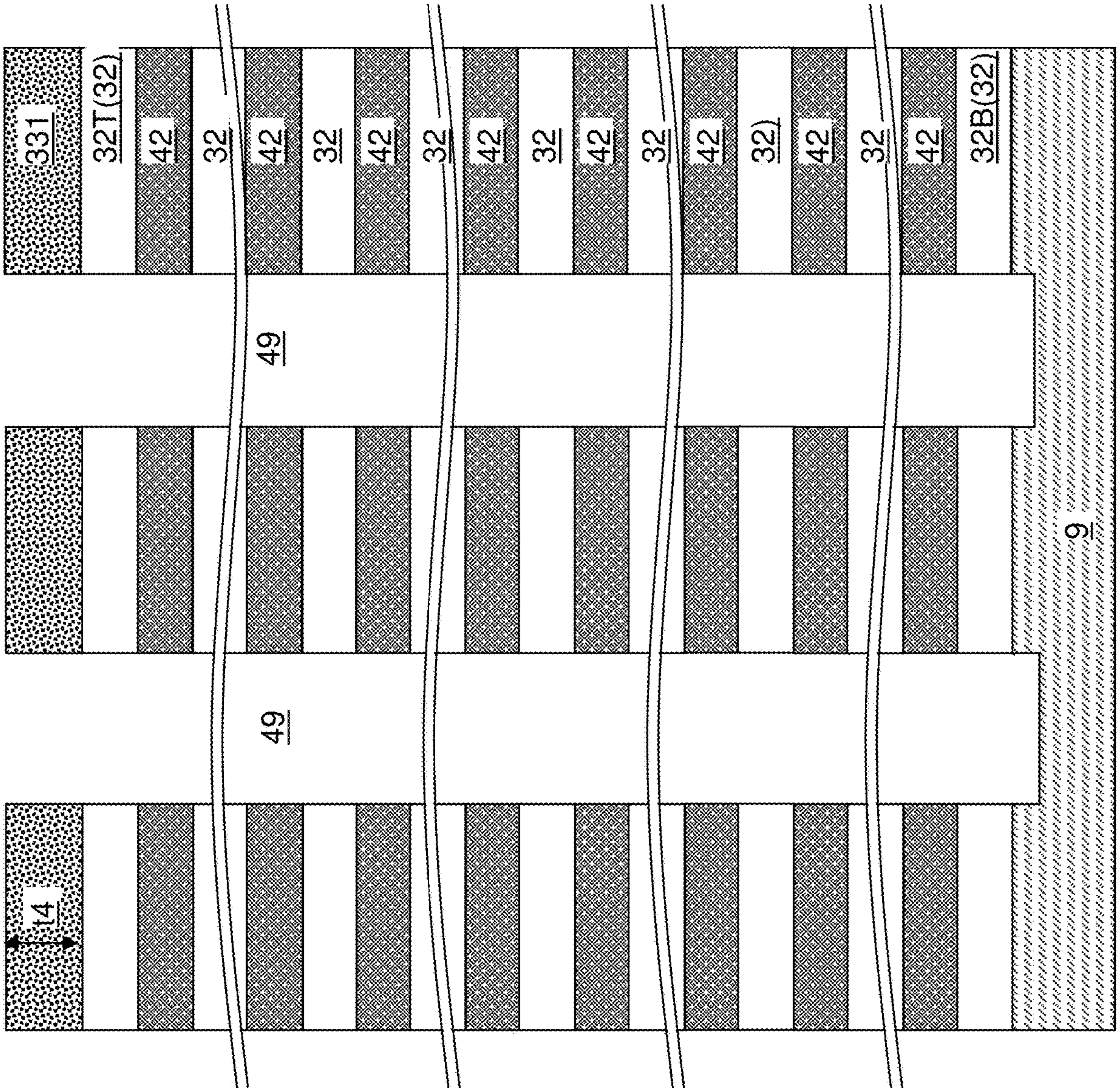

Referring to FIGS. 4H, 5A, and 5B, the exemplary structure can be transferred from the cladding liner deposition chamber 540 used to deposit the third cladding liner 335C, through the vacuum transfer chamber 510, into an etch chamber 530. An anisotropic etch process within the third instance of the unit processing sequence can be performed to etch unmasked upper portions of the alternating stack (32, 42) that are not masked by the combination of the etch mask material layer 331 and the third cladding liner 335C. The anisotropic etch process within the third instance of the unit processing sequence may be the same as the anisotropic etch process within the first instance of the unit processing sequence. Each opening, such as a memory opening 49 or a support opening, can be vertically extended through a subset of the layers in the alternating stack (32, 42) underneath each opening in the etch mask material layer 331. Generally, each opening can be vertically extended through the alternating stack (32, 42) to a top surface of an underlying substrate (such as the substrate 9) during the anisotropic etch step of the last instance of the unit processing sequence.

The third cladding liner 335C may be consumed during the anisotropic etch process within the second instance of the unit processing sequence. The thickness of the etch mask material layer 331 after the anisotropic etch process in the third instance of the unit processing sequence may be the same as or may be less than the third thickness t3, and is herein referred to as a fourth thickness t4. The fourth thickness t4 may be in a range from 0.3 micron to 5 microns, such as 0.5 microns to 1.5 microns although lesser and greater values may also be employed.

While an embodiment is described in which three instances of the unit processing sequence are repeated to form openings (such as memory openings 49 and support openings) through the alternating stack (32, 42), embodiments are expressly employed herein in which a different number of repetitions of the unit processing sequence is used to form the openings.

Referring collectively to FIGS. 4C-4H, 5A, and 5B, the multiple instances of the unit processing sequence comprises N instances of the unit processing sequence in which N may be an integer greater than 1; a total number of the at least one cladding liner deposition chamber 540 in the integrated processing apparatus 500 may be less than N; and at least one of the at least one cladding liner deposition chamber 540 performs a plurality of cladding liner deposition processes on the assembly. Generally, the exemplary structure described with reference to FIGS. 4B-4H may transit through the vacuum transfer chamber 510 shown in FIGS. 5A and 5B during each transfer between processes during the multiple instances of the unit processing sequences.

Referring collectively to FIGS. 4A-4H, 5A, and 5B, the integrated processing apparatus 500 may comprise at least one loadlock 520 attached to the vacuum transfer chamber 510; the exemplary structure illustrated in FIG. 4A can be loaded into a first loadlock 520 prior to iteratively performing the multiple instances of the unit processing sequence; and the exemplary structure can be unloaded out of a second loadlock 520 after iteratively performing the multiple instances of the unit processing sequence. The exemplary structure can be transferred into each chamber (530, 540) employed in the multiple instances of the unit processing sequence employing a transfer robot 550, and the exemplary structure may remain under vacuum between initiation of the multiple instances of the unit processing sequences and termination of the multiple instances of the unit processing sequence.

Figure 4I:
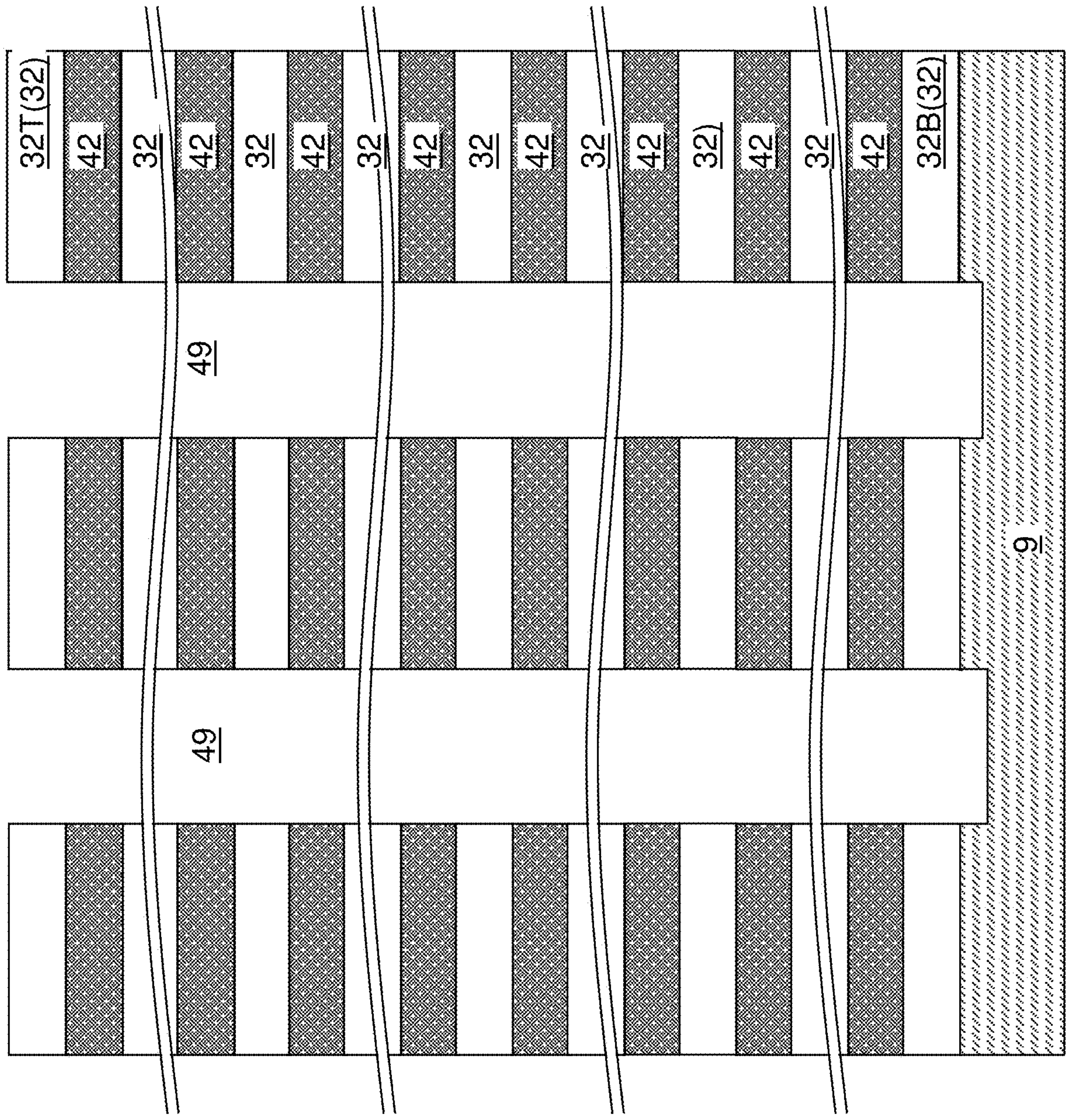

Referring to FIG. 4I, any remaining portion of the etch mask material layer 331 can be subsequently removed, for example, by performing an ashing process in an ashing process chamber.

FIGS. 6A-6D are sequential schematic vertical cross-sectional views of a memory opening within the exemplary structure during formation of a memory opening fill structure 58 in a memory opening 49 according to an embodiment of the present disclosure.

Figure 6B:
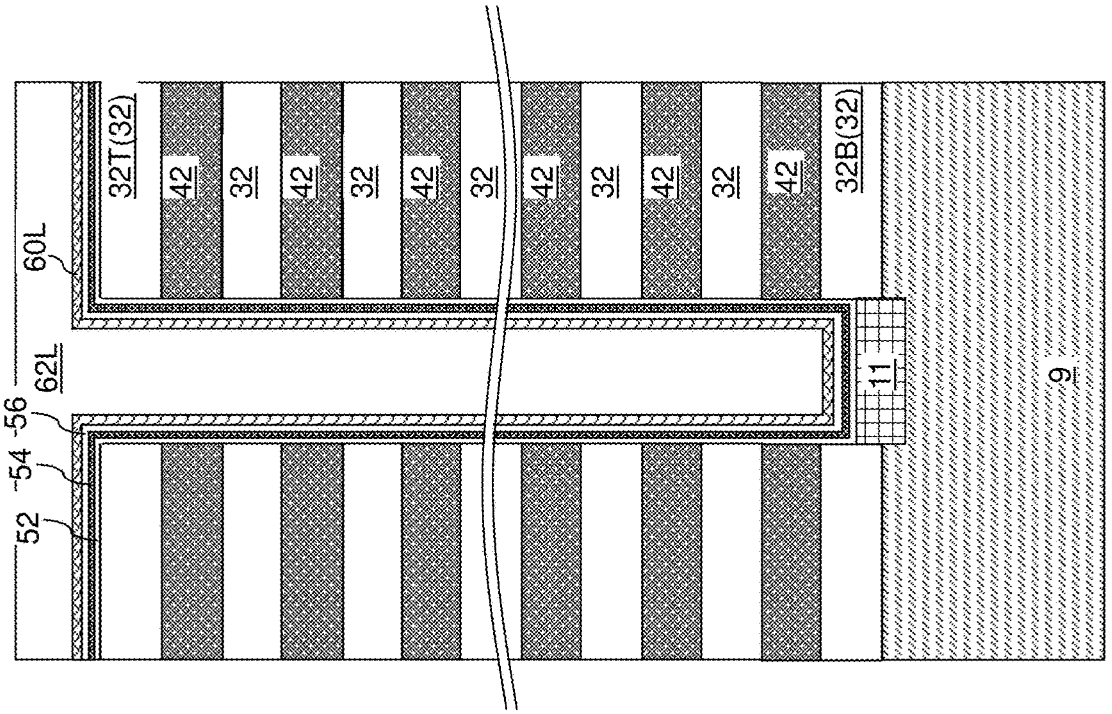
FIGS. 6A-6D are sequential schematic vertical cross-sectional views of a memory opening within the exemplary structure during formation of a memory opening fill structure according to an embodiment of the present disclosure.
Figure 6A:
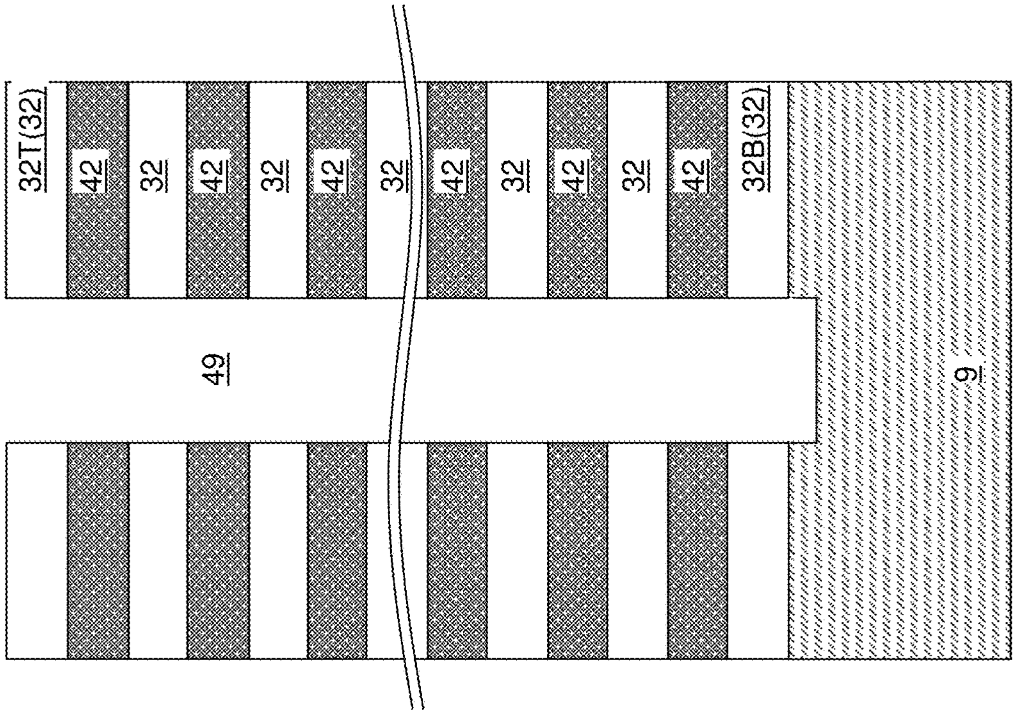

Referring to FIG. 6A, a memory opening 49 in the exemplary device structure of FIG. 4I is illustrated. The memory opening 49 extends through the alternating stack (32, 42) and optionally into an upper portion of the substrate 9. The recess depth of the bottom surface of each memory opening with respect to the top surface of the substrate 9 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 6B, pillar structures 11 can be formed at the bottom of the memory openings 49. For example, the pillar structures 11 can comprise a semiconductor material, such as single crystalline silicon, formed by selective growth of the semiconductor material from physically exposed surfaces of the substrate 9. A selective semiconductor deposition process such as a selective epitaxy process may be employed to form the pillar structures 11.

Subsequently, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed. A dielectric core layer 62L comprising a dielectric fill material can be deposited in remaining volumes of the memory openings 49 and over the alternating stack (32, 42).

Figure 6D:
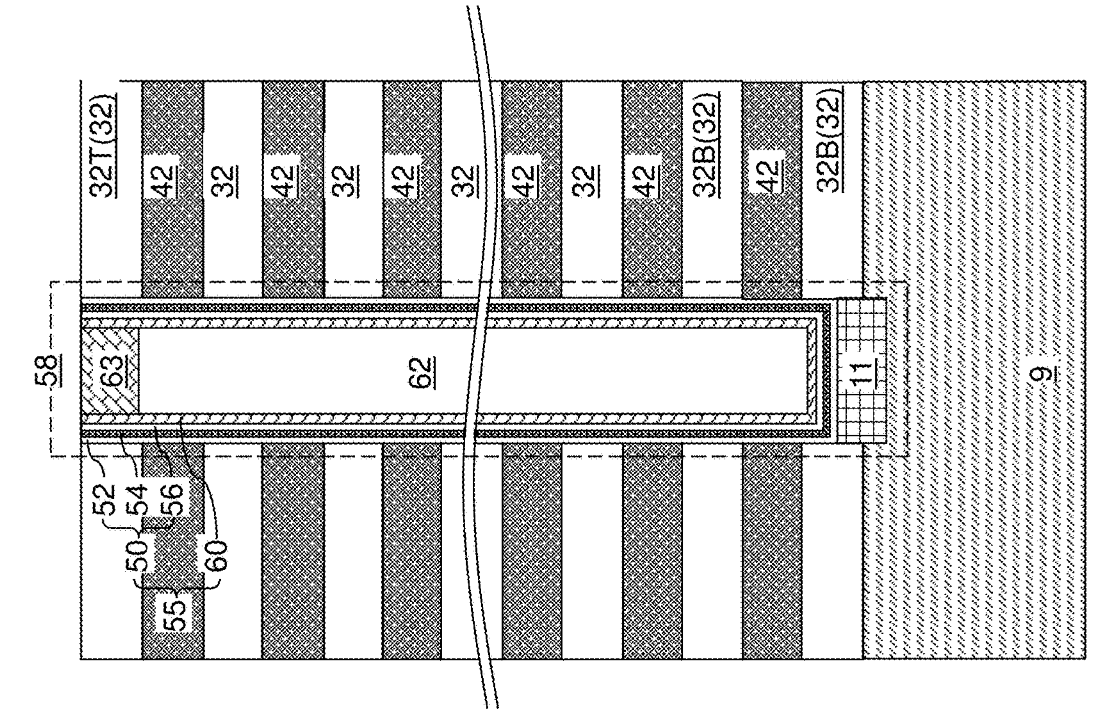
Figure 6C:
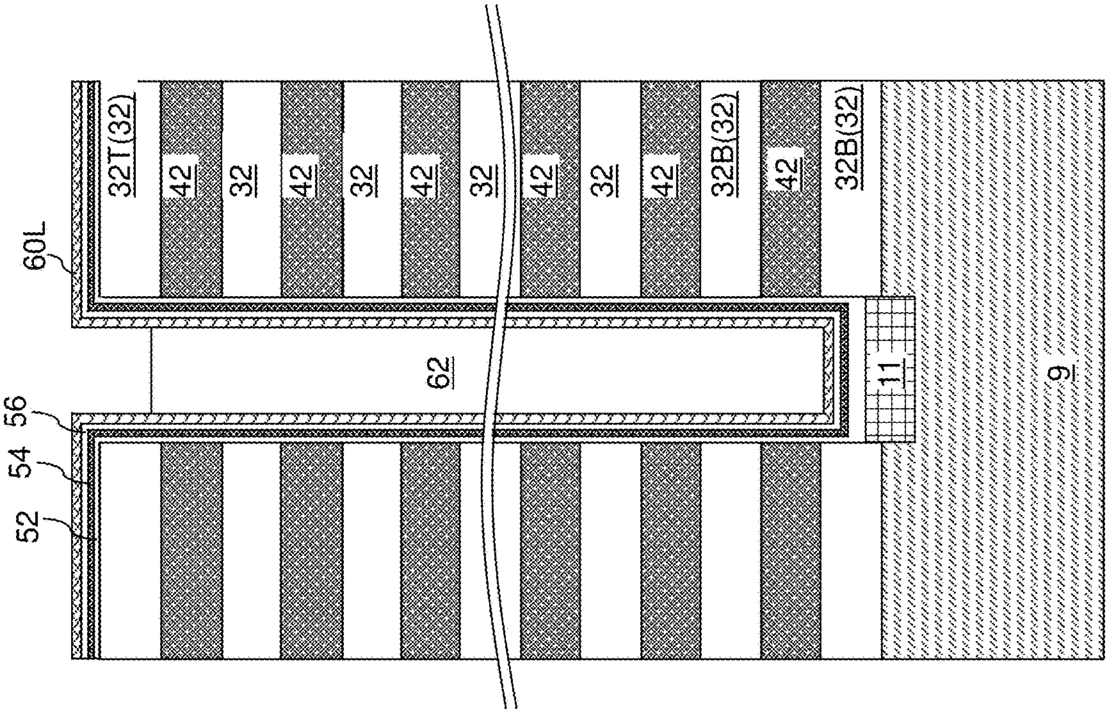

Referring to FIG. 6C, the dielectric core layer 62L can be vertically recessed such that each remaining portion of the dielectric core layer 62L has a top surface at, or about, the horizontal plane including the bottom surface of the topmost insulating layers 32T. Each remaining portion of the dielectric core layer 62L constitutes a dielectric core 62.

Referring to FIG. 6D, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a pillar structure 11, a memory stack structure 55, a dielectric core 62, and a drain region 63 within a memory opening 49 constitutes a memory opening fill structure 58. Each memory opening fill structure 58 comprises a respective vertical stack of memory elements, which may be embodied as portions of the memory material layer 54 located at levels of the sacrificial material layers 42, or generally speaking, at levels of spacer material layers that may be formed as, or may be subsequently replaced at least partly with, electrically conductive layers.

Figure 7A:
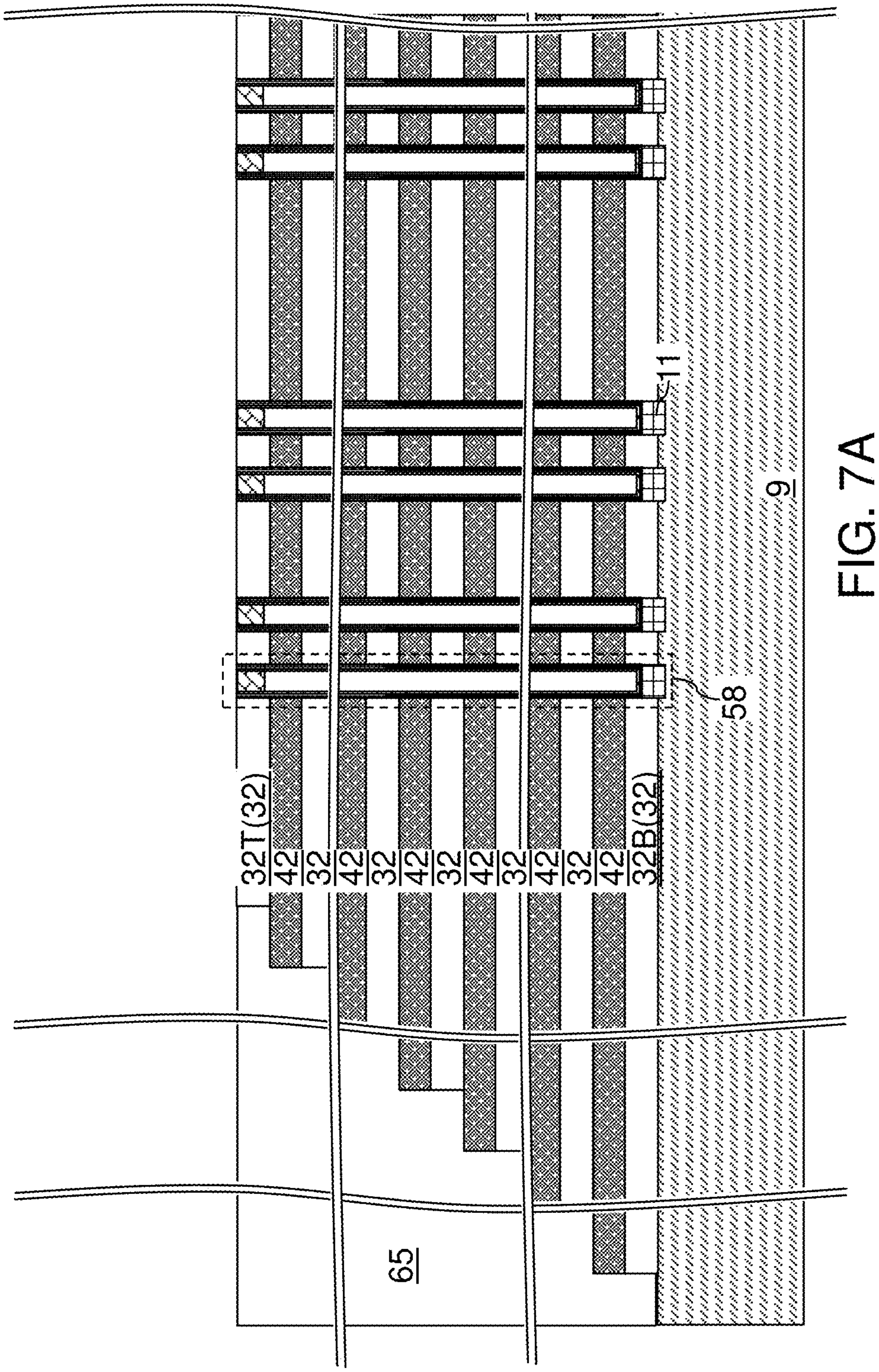
FIG. 7A is a schematic vertical cross-sectional view of the exemplary structure after formation of memory stack structures and support pillar structures according to an embodiment of the present disclosure.
Figure 7B:
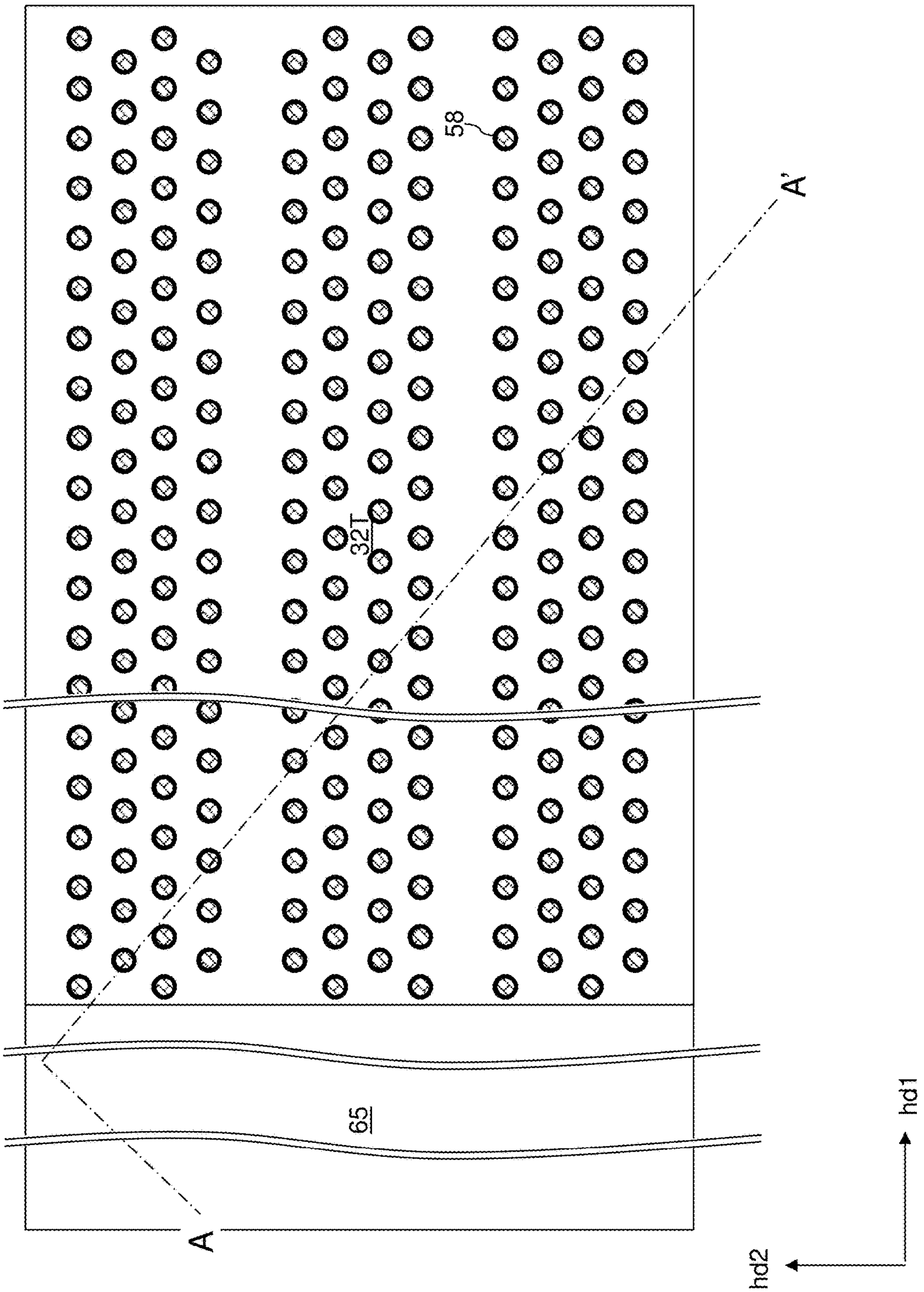
FIG. 7B is a top-down view of the exemplary structure of FIG. 7A. The vertical plane A-A' is the plane of the cross-section for FIG. 7A.

Referring to FIGS. 7A and 7B, the exemplary structure is illustrated after formation of memory opening fill structures 58 within the memory openings 49. Each of the memory opening fill structures 58 may comprise a pillar structure 11 on which a memory film 50 and a vertical semiconductor channel 60 are formed. Optionally, support pillar structures (not shown) may be formed in support openings (not shown) through the alternating stack (32, 42) concurrently with formation of the memory opening fill structures 58 such that each of the support pillar structures has a substantially same structure as a memory opening fill structure 58. Alternatively or additionally, dielectric support pillar structures may be formed in support openings through the alternating stack (32, 42) prior to, or after, formation of the memory opening fill structures 58.

Figure 8A:
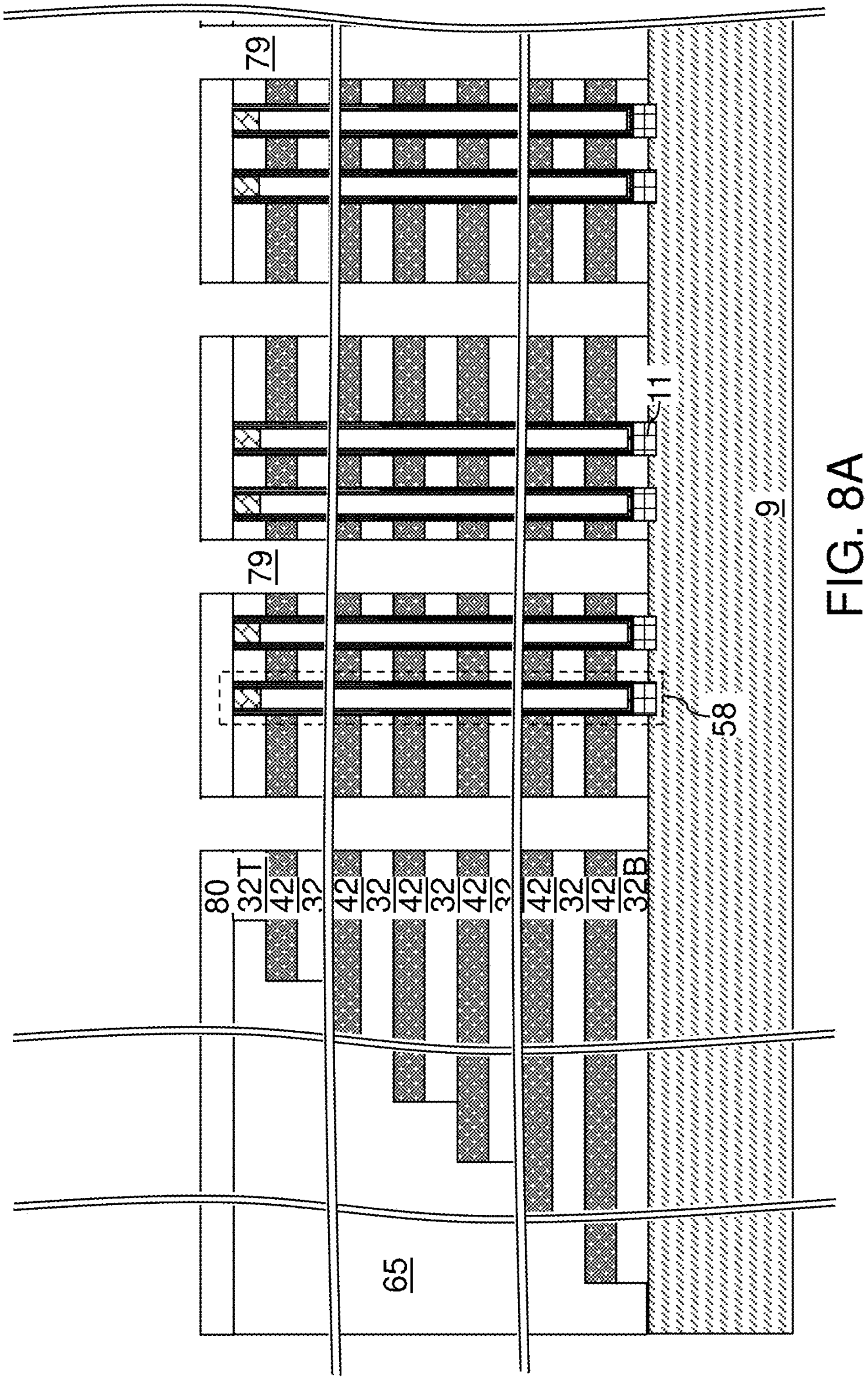
FIG. 8A is a schematic vertical cross-sectional view of the exemplary structure after formation of backside trenches and source regions according to an embodiment of the present disclosure.
Figure 8B:
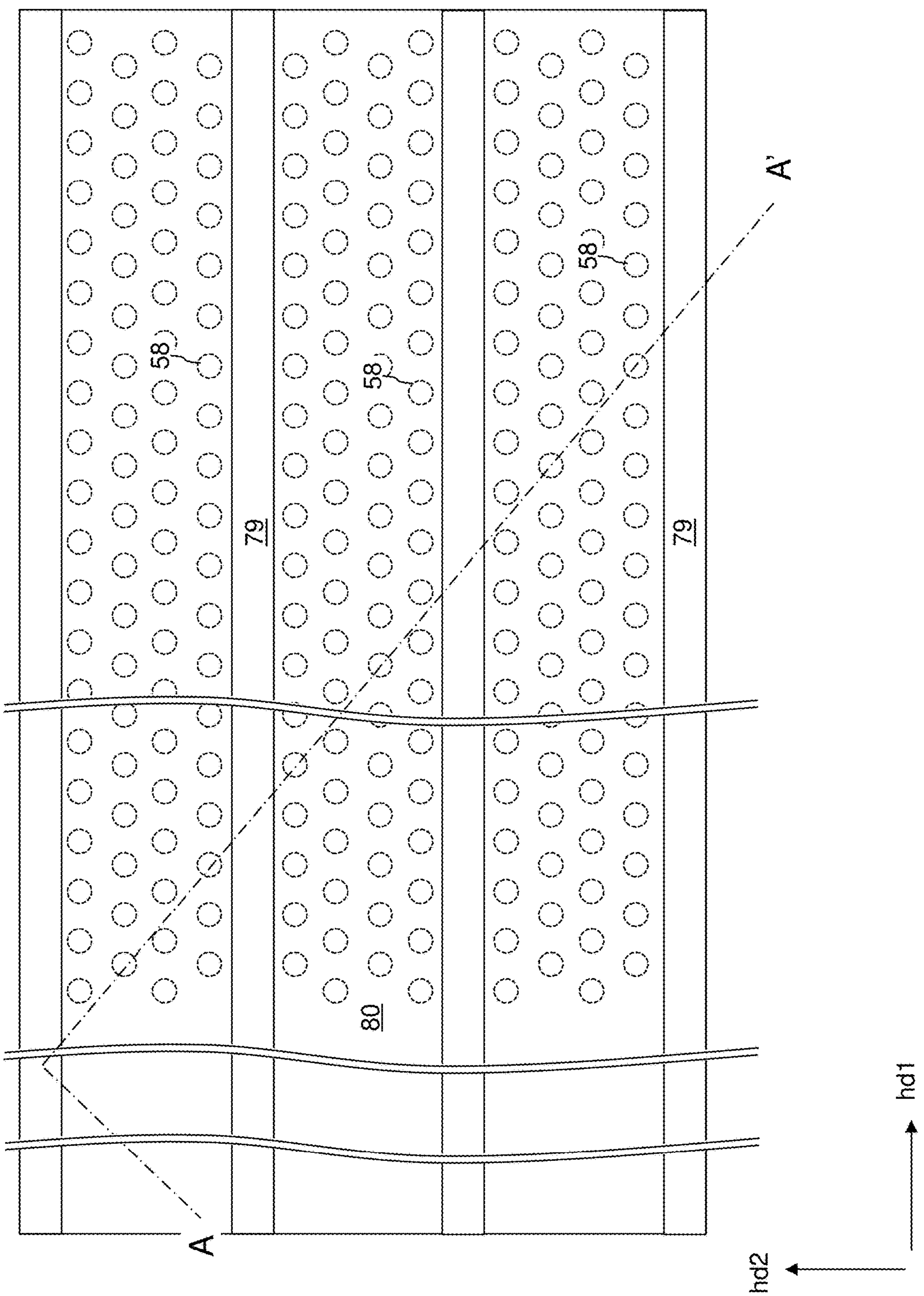
FIG. 8B is a partial see-through top-down view of the exemplary structure of FIG. 8A. The vertical plane A-A' is the plane of the schematic vertical cross-sectional view of FIG. 8A.

Referring to FIGS. 8A and 8B, a contact-level dielectric layer 80 can be formed over the alternating stack (32, 42). A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the retro-stepped dielectric material portion 65. Lateral isolation trenches 79 laterally extending along the first horizontal direction hd1 can be formed through the alternating stack (32, 42), the retro-stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the substrate 9 to the top surface of the contact-level dielectric layer 80. A top surface of the substrate 9 can be physically exposed underneath each lateral isolation trench 79. The photoresist layer can be subsequently removed, for example, by ashing.

Figure 9:
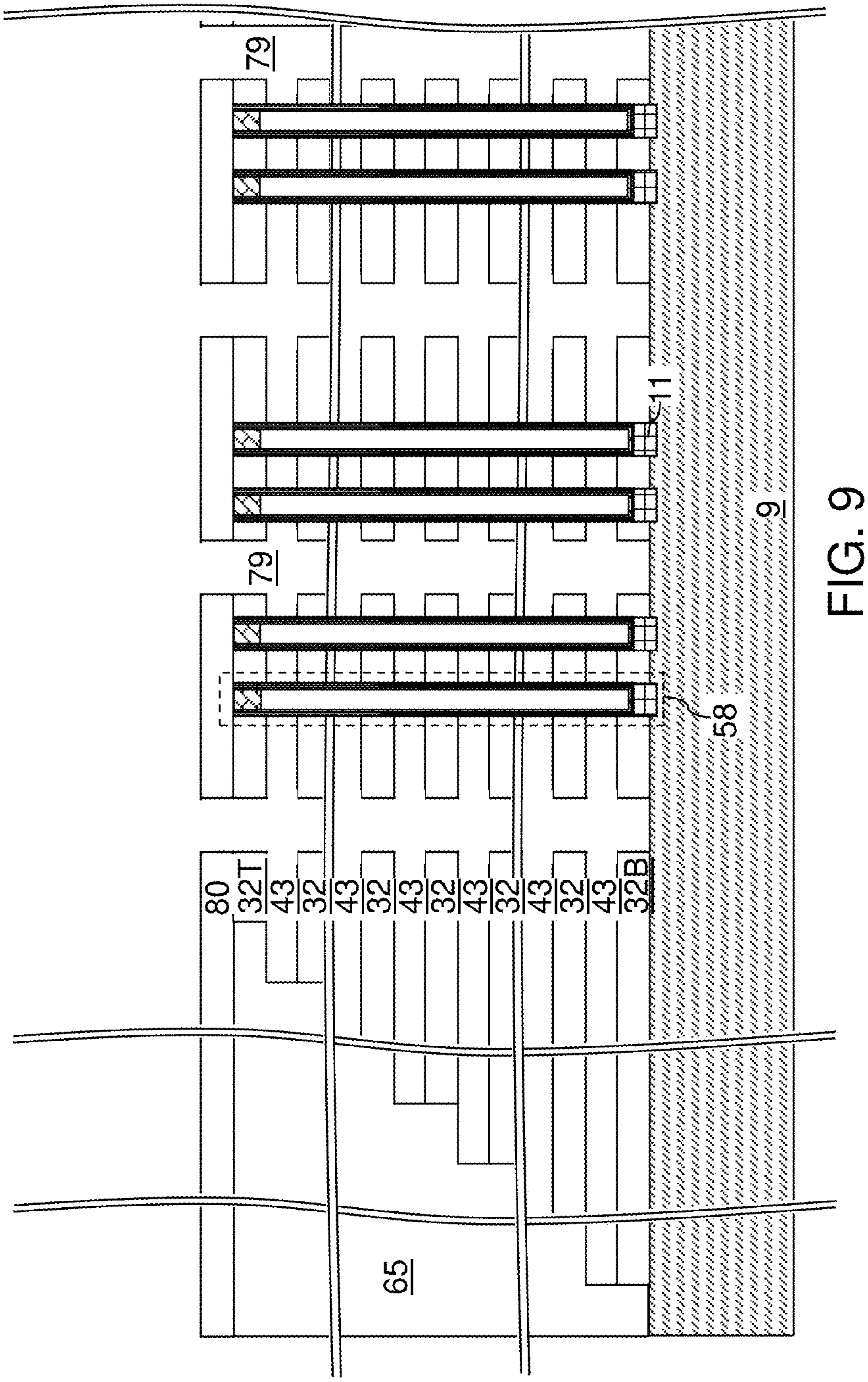
FIG. 9 is a schematic vertical cross-sectional view of the exemplary structure after formation of backside recesses according to an embodiment of the present disclosure.

Referring to FIG. 9, an isotropic etch process can be performed to remove the sacrificial material layers 42 selective to the insulating layers 32, the memory opening fill structures 58, and the substrate 9. Lateral recesses 43 can be formed in volumes from which the sacrificial material layers 42 are removed. Sidewall surface segments of the memory opening fill structures 58 can be physically exposed to the lateral recesses 43. In an illustrative example, if the sacrificial material layers 42 comprise silicon nitride, the isotropic etch process may comprise a wet etch process employing hot phosphoric acid.

Figure 10:
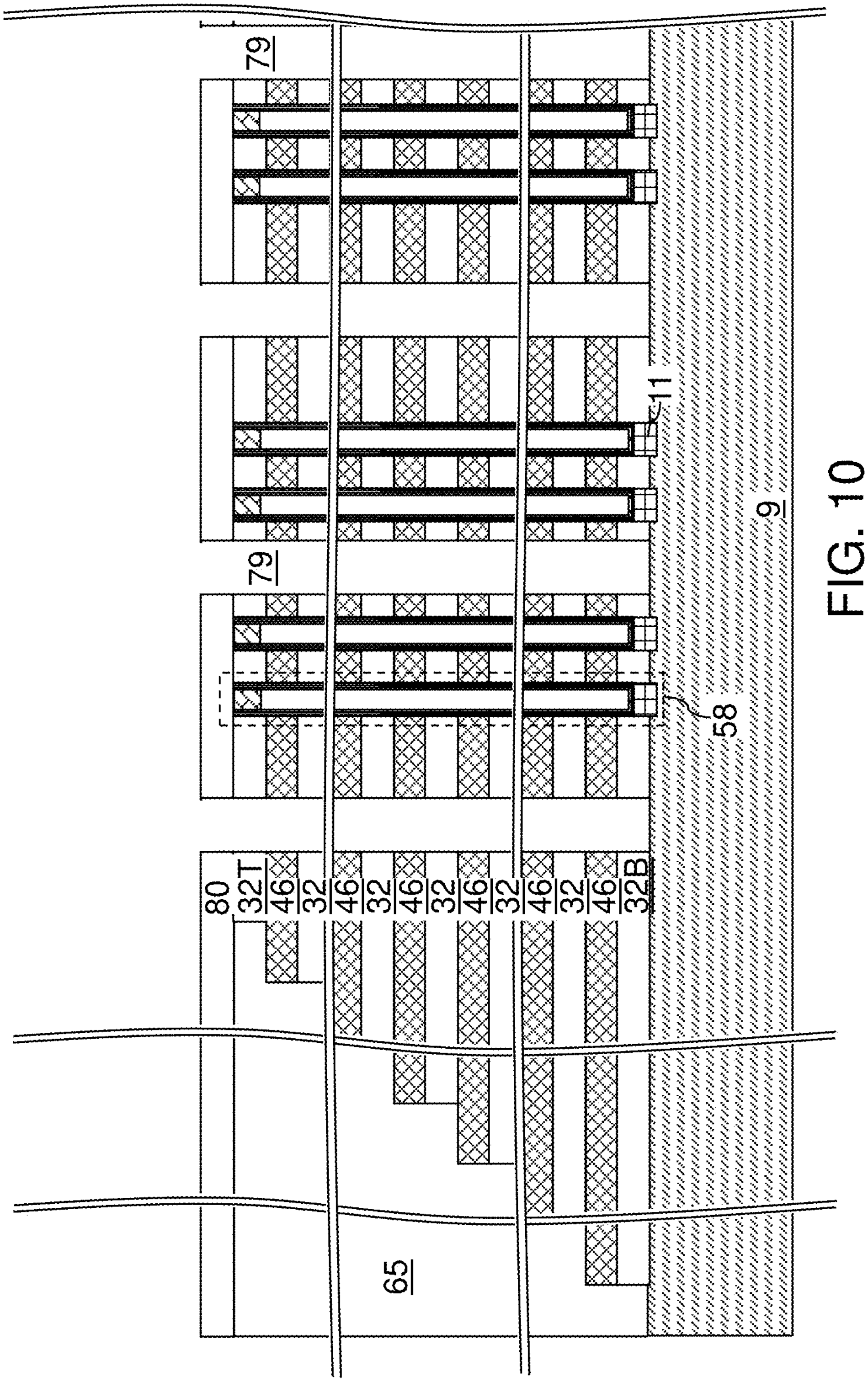
FIG. 10 is a schematic vertical cross-sectional view of the exemplary structure after formation of electrically conductive layers in the backside recesses according to an embodiment of the present disclosure.

Referring to FIG. 10, a backside blocking dielectric layer (not shown) can be optionally formed in the lateral recesses 43 by a conformal deposition process. At least one conductive material, such as at least one metallic material, can be conformally deposited in the lateral recesses 43. The at least one conductive material may comprise, for example, a combination of a metallic barrier material and a metallic fill material. The metallic barrier material may comprise, for example, TiN, TaN, WN, MON, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the contact-level dielectric layer 80 can be removed by performing an etch-back process, which may comprise an isotropic etch process and/or an anisotropic etch process. Each remaining portion of the at least one conductive material filling a respective one of the lateral recesses 43 constitutes an electrically conductive layer 46. An alternating stack of insulating layers 32 and electrically conductive layers 46 can be formed between each neighboring pair of lateral isolation trenches 79 over the carrier substate 8. A plurality of alternating stacks of insulating layers 32 and electrically conductive layers 46 can be laterally spaced apart from each other by the lateral isolation trenches 79.

Figure 11:
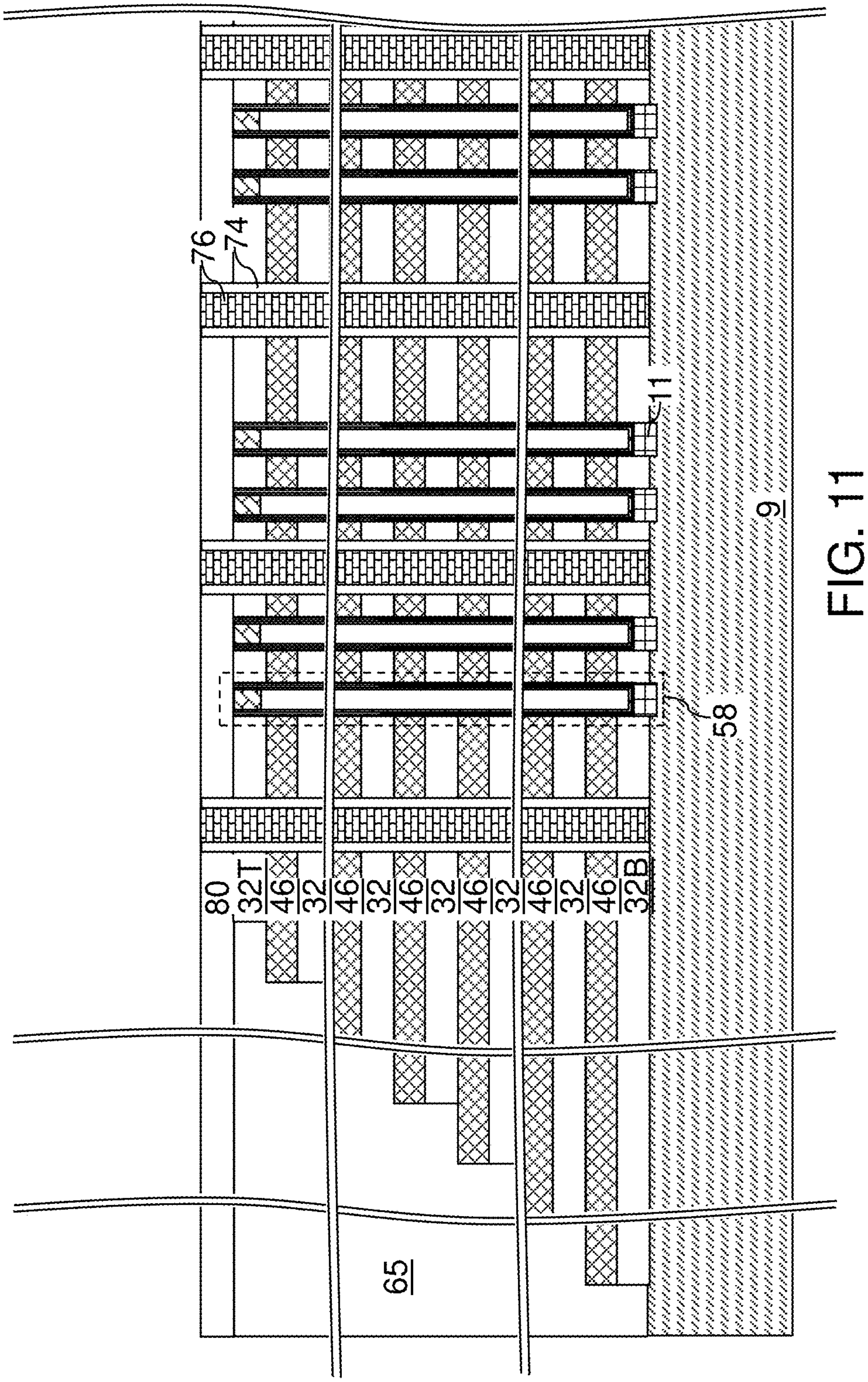
FIG. 11 is a schematic vertical cross-sectional view of the exemplary structure after formation of insulating spacers and backside contact via structures according to an embodiment of the present disclosure.

Referring to FIG. 11, an insulating material may be conformally deposited and anisotropically etched to form an insulating spacer at the periphery of each of the lateral isolation trenches 79. At least one conductive fill material may be deposited in remaining volumes of the lateral isolation trenches 79 to form a conductive wall structure 76. Each contiguous combination of a conductive wall structure 76 and an insulating spacer 74 constitutes an isolation trench fill structure (74, 76) that fills a respective lateral isolation trench 79.

Figure 12:
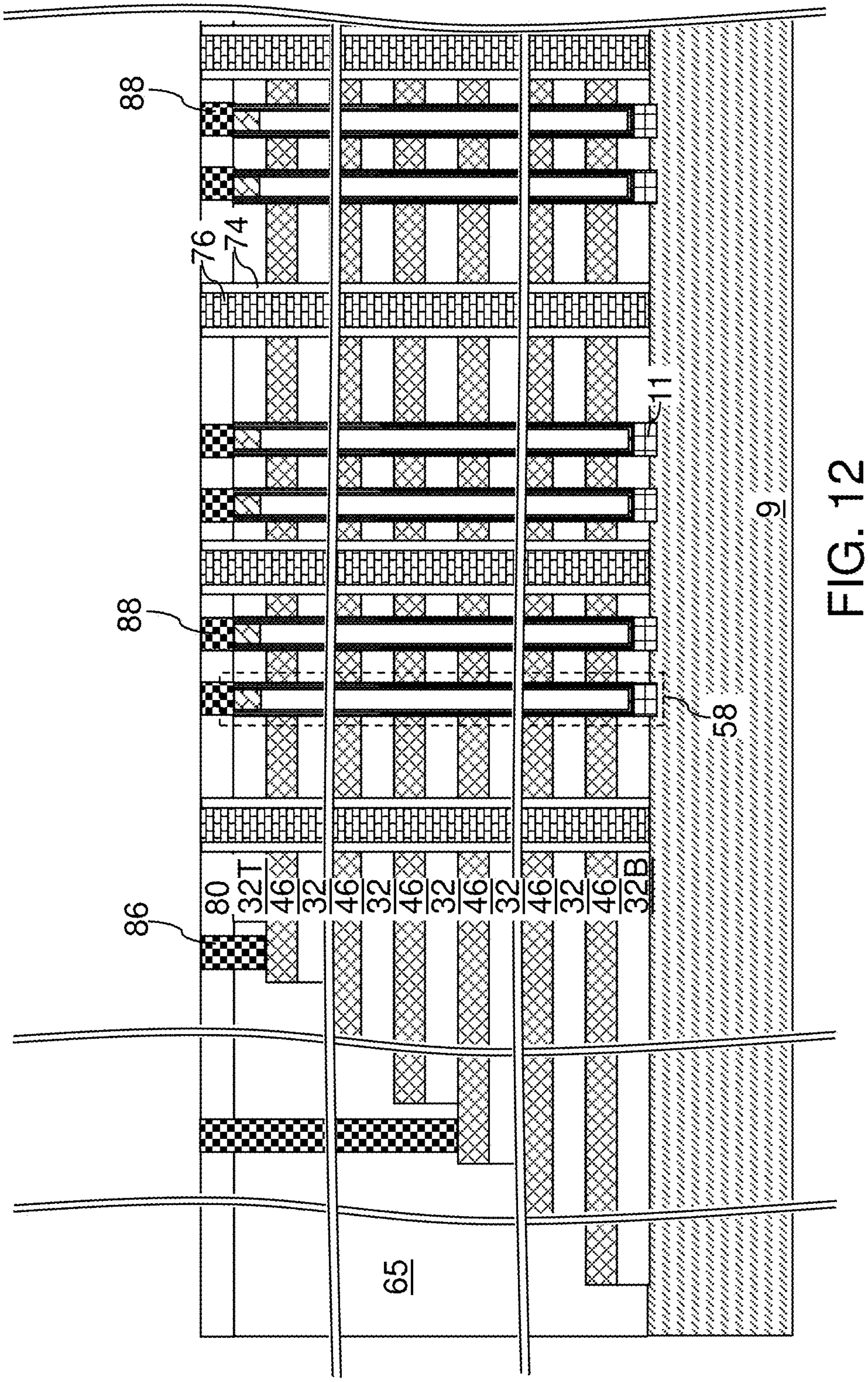
FIG. 12 is a schematic vertical cross-sectional view of the exemplary structure after formation of additional contact via structures according to an embodiment of the present disclosure.

Referring to FIG. 12, a photoresist layer (not shown) can be applied over the contact-level dielectric layer 80, and can be lithographically patterned to form openings therethrough. An anisotropic etch process can be performed to transfer the pattern of the openings in the photoresist layer through the contact-level dielectric layer 80 and optionally through the retro-stepped dielectric material portion 65. Various contact via cavities can be formed through the contact-level dielectric layer 80 and the retro-stepped dielectric material portion 65. The photoresist layer can be subsequently removed, for example, by ashing.

At least one conductive material, such as a combination of a metallic barrier material and a metallic fill material, can be deposited in the contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the various contact via cavities constitute various contact via structures (86, 88). The various contact via structures (86, 88) may comprise layer contact via structures (e.g., word line contact via structures) 86 vertically extending through the contact-level dielectric layer 80 and the retro-stepped dielectric material portion 65 and contacting a respective one of the electrically conductive layers 86, drain contact via structures 88 contacting a top surface of a respective one of the drain regions 63.

Figure 13A:
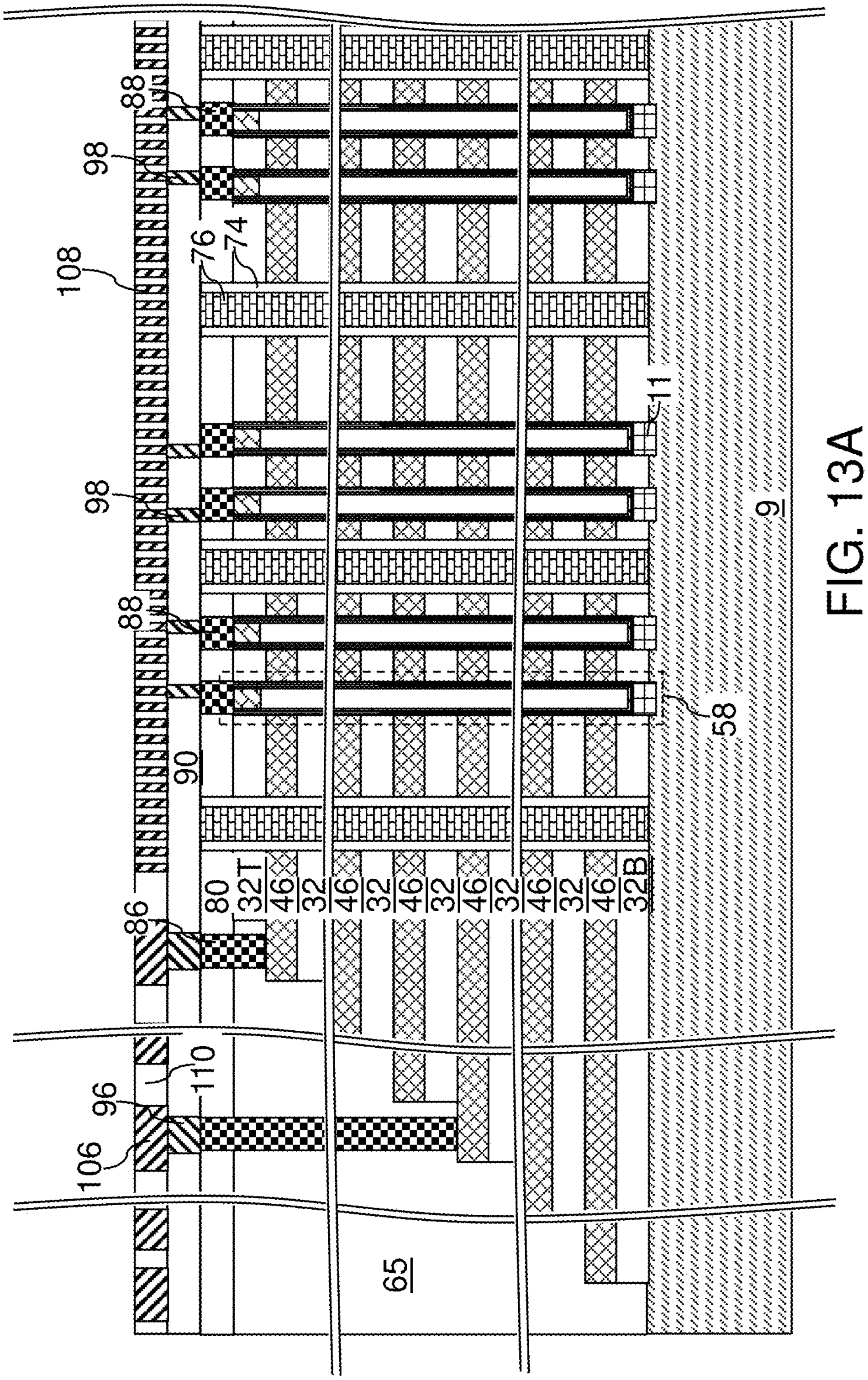
FIG. 13A is a schematic vertical cross-sectional view of the exemplary structure after formation of connection via structures and first-level metal lines according to an embodiment of the present disclosure.
Figure 13B:
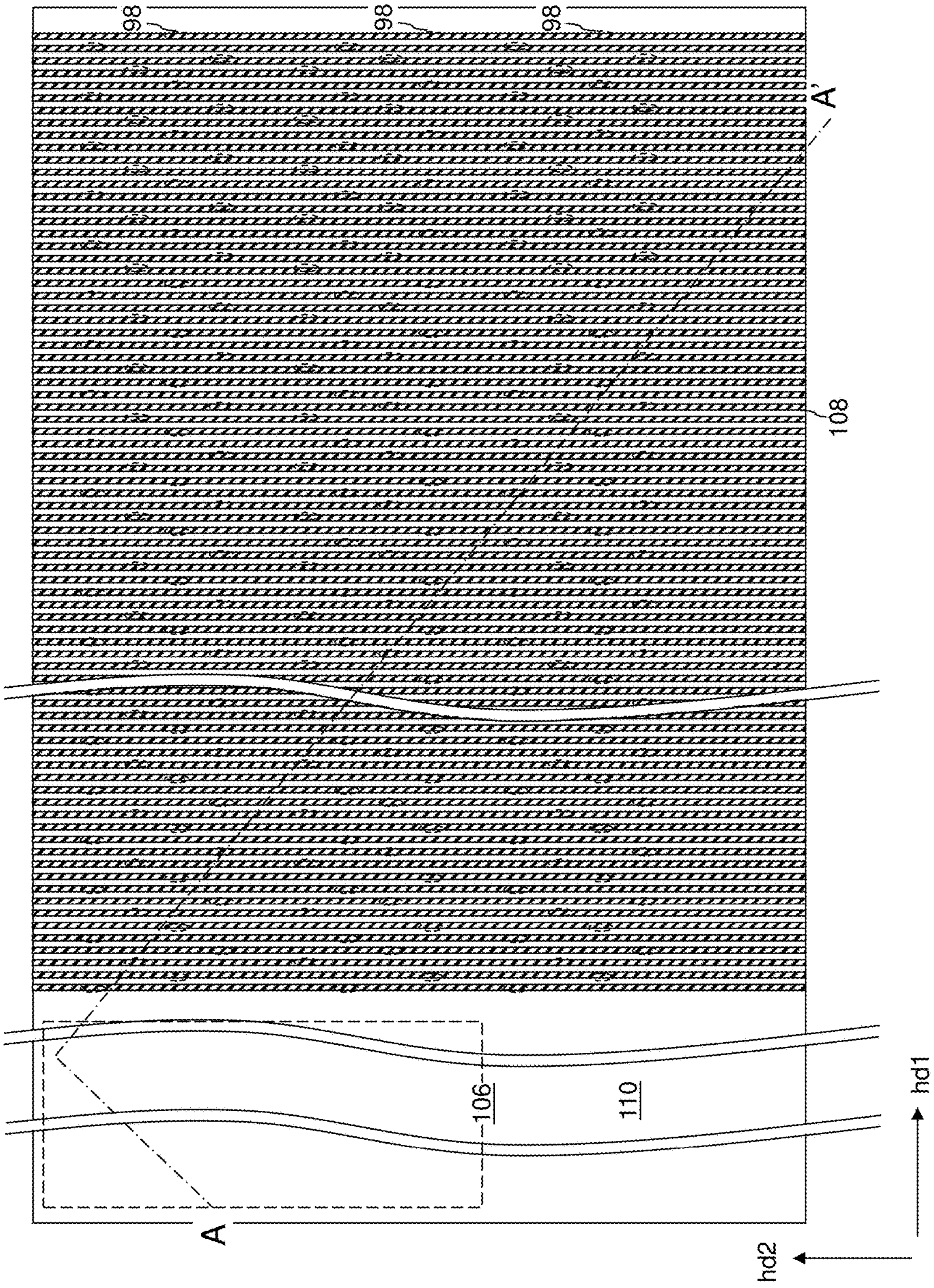
FIG. 13B is a top-down view of the exemplary structure of FIG. 13A. The vertical plane A-A' is the plane of the schematic vertical cross-sectional view of FIG. 13A.

Referring to FIGS. 13A and 13B, a connection-level dielectric layer 90 can be formed over the contact-level dielectric layer 80 by deposition of a dielectric material such as silicon oxide. Connection via structures (98, 96) can be formed through the connection-level dielectric layer 90 on a respective one of the contact via structures (86, 88). For example, bit-line-connection via structures 98 can be formed on the drain contact via structures 88, and layer connection via structures 96 can be formed on the layer contact via structures 86.

A bit-line-level dielectric material layer 110 can be formed over the connection-level dielectric layer 90. The bit-line-level dielectric material layer 110 includes an interconnect-level dielectric (ILD) material such as undoped silicate glass, a doped silicate glass, or porous or non-porous organosilicate glass. The thickness of the first dielectric material layer 110 may be in a range from 50 nm to 300 nm, although lesser and greater thicknesses may also be employed.

Bit-line-level metal interconnect structures (108, 106) can be formed in the first dielectric material layer 110. In one embodiment, the bit-line-level metal interconnect structures (108, 106) may include bit lines 108 and first word-line-connection metal lines 106. The bit lines 108 can be parallel from each other, and can laterally extend along the second horizontal direction hd2 that is perpendicular to the lengthwise direction of the isolation trench fill structures (74, 76).

The various embodiments of the present disclosure can be employed to etch high-aspect-ratio openings employing multiple cladding liner deposition processes and multiple anisotropic etch processes without exposing a structure under etch to the atmosphere. In one embodiment, the multiple instances of a unit processing sequence are performed without breaking vacuum in the integrated processing apparatus (i.e., the vacuum cluster tool). Thus, in one embodiment, the pressure of the environment for the exemplary structure may be maintained below $1.0\times10^{-4}$ Pa throughout the entirety of the processing steps described with reference to FIGS. 4B-4H. Thus, contamination of a semiconductor device due to exposure to the atmosphere can be prevented. Further, repetition of cladding liner deposition processes over an etch mask material layer can reduce erosion of the etch mask material layer during the entirety of the processing steps used to form such high-aspect-ratio openings. By reducing the erosion in the pattern of the etch mask material layer during formation of the high-aspect-ratio openings, the high-aspect-ratio openings can be formed with less widening of top portions and/or with less bowing, and thus can have an enhanced etch profile in which sidewalls of the openings have a straighter vertical cross-sectional profile.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word “comprise” or “include” contemplates all embodiments in which the word “consist essentially of” or the word “consists of” replaces the word “comprise” or “include,” unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method, comprising:

forming an alternating stack of first material layers and second material layers over a substrate;

forming an etch mask material layer over the alternating stack;

loading an assembly comprising the etch mask material layer, the alternating stack, and the substrate into an integrated processing apparatus including a plurality of etch chambers and at least one cladding liner deposition chamber; and iteratively performing multiple instances of a unit processing sequence without breaking vacuum in the integrated processing apparatus, wherein the unit processing sequence comprises:

a respective cladding liner deposition process in which a respective cladding material is anisotropically deposited over the etch mask material layer in a respective one of the at least one cladding liner deposition chamber, and a respective anisotropic etch process in which respective portions of the alternating stack that are not masked by the etch mask material layer are anisotropically etched in a respective etch chamber selected from the plurality of etch chambers;

wherein each of the anisotropic etch processes is longer than each of the cladding liner deposition processes, and wherein a ratio of a total number of the etch chambers to a total chamber number of the cladding liner deposition chambers is 2 to 10.

2. The method of claim 1, wherein the integrated processing apparatus comprises a vacuum cluster tool containing a vacuum transfer chamber that is connected to each of the plurality of etch chambers and the at least one cladding liner deposition chamber.

3. The method of claim 2, wherein the assembly transits through the vacuum transfer chamber during each transfer between steps of the multiple instances of the unit processing sequences.

4. The method of claim 2, wherein:

the integrated processing apparatus further comprises at least one loadlock attached to the vacuum transfer chamber;

the assembly is loaded into a first loadlock prior to iteratively performing the multiple instances of the unit processing sequence; and the assembly is unloaded out of a second loadlock after iteratively performing the multiple instances of the unit processing sequence.

5. The method of claim 2, further comprising transferring the assembly between the vacuum transfer chamber and the plurality of etch chambers and the at least one cladding liner deposition chamber using a transfer robot comprising at least one robot arm.

6. The method of claim 1, wherein the assembly remains under vacuum between initiation of the multiple instances of the unit processing sequences and termination of the multiple instances of the unit processing sequence.

7. The method of claim 1, wherein each of the at least one cladding liner deposition chamber comprises a respective physical vapor deposition chamber, and the respective cladding liner deposition process comprises a sputtering process or an ion beam deposition process.

8. The method of claim 7, wherein the cladding material comprises a conductive material, a semiconductor material, or an insulating material.

9. The method of claim 1, wherein each of the plurality of etch chambers comprises a respective reactive ion etch chamber, and the respective anisotropic etch process comprises a reactive ion etch process that etches materials of the first material layers and the second material layers within the alternating stack.

10. The method of claim 1, wherein:

the first material layers comprise silicon oxide layers;

the second material layers comprise silicon nitride layers; and each of the reactive ion etch processes employs at least one respective etchant gas comprising a fluorocarbon gas, a hydrofluorocarbon gas, a fluorochlorocarbon gas, nitrogen trifuoride gas, or sulfur hexafluoride gas.

11. The method of claim 1, wherein the etch mask material layer comprises a carbon-based material comprising carbon atoms at an atomic concentration greater than 50%.

12. The method of claim 1, further comprising performing an initial anisotropic etch process which etches at least the etch mask material layer prior to performing the multiple instances of the unit processing sequence and prior to depositing any cladding material on the etch mask material layer.

13. The method of claim 1, wherein:

the multiple instances of the unit processing sequence comprises N instances of the unit processing sequence in which N is an integer greater than 1;

a total number of the at least one cladding liner deposition chamber in the integrated processing apparatus is less than N; and a plurality of cladding liner deposition processes are performed in the same cladding liner deposition chamber.

14. The method of claim 1, further comprising:

forming a memory film and a vertical semiconductor channel in each of respective memory openings formed in the portions of the alternating stack that are anisotropically etched; and replacing the second material layers with word lines to form a three-dimensional memory device.

* * * * *